US011381768B2

United States Patent
Shim et al.

(10) Patent No.: US 11,381,768 B2
(45) Date of Patent: Jul. 5, 2022

(54) IMAGE SENSOR WITH PIXELS INCLUDING PHOTODIODES SHARING FLOATING DIFFUSION REGION

(71) Applicant: SAMSUNG ELECTRONICS CO., LTD., Suwon-si (KR)

(72) Inventors: Eunsub Shim, Hwaseong-si (KR); Kyungho Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 18 days.

(21) Appl. No.: 16/852,679

(22) Filed: Apr. 20, 2020

(65) Prior Publication Data

US 2020/0358971 A1  Nov. 12, 2020

(30) Foreign Application Priority Data

May 7, 2019  (KR) .......................... 10-2019-0053242
Aug. 16, 2019  (KR) .......................... 10-2019-0100535

(51) Int. Cl.
*H04N 5/347* (2011.01)
*H04N 5/369* (2011.01)
(Continued)

(52) U.S. Cl.
CPC ... *H04N 5/36961* (2018.08); *H01L 27/14641* (2013.01); *H04N 5/347* (2013.01);
(Continued)

(58) Field of Classification Search
CPC .... H04N 5/343; H04N 5/3454; H04N 5/3456; H04N 5/347; H04N 5/349;
(Continued)

(56) References Cited

U.S. PATENT DOCUMENTS 9,247,170 B2 *  1/2016  Komori ............... H04N 5/3742
9,386,285 B2    7/2016  Okigawa
(Continued)

FOREIGN PATENT DOCUMENTS

JP  5690977        2/2015
JP  2018-074311 A  5/2018
JP  6408372        9/2018

*Primary Examiner* — Lin Ye
*Assistant Examiner* — Chris S Yoder, III
(74) *Attorney, Agent, or Firm* — Volentine, Whitt & Francos, PLLC

(57) ABSTRACT

An image sensor operating in multiple resolution modes including a low resolution mode and a high resolution mode includes a pixel array including a plurality of pixels, wherein each pixel in the plurality of pixels comprises a micro-lens, a first subpixel including a first photodiode, a second subpixel including a second photodiode, and the first subpixel and the second subpixel are adjacently disposed and share a floating diffusion region. The image sensor also includes a row driver providing control signals to the pixel array to control performing of an auto focus (AF) function, such that performing the AF function includes performing the AF function according to pixel units in the high resolution mode and performing the AF function according to pixel group units in the low resolution mode. A resolution corresponding to the low resolution mode is equal to or less than ¼ times a resolution corresponding to the high resolution mode.

12 Claims, 19 Drawing Sheets

(51) Int. Cl.
*H04N 5/3745* (2011.01)
*H01L 27/146* (2006.01)
*H04N 5/349* (2011.01)
*H04N 9/04* (2006.01)
*H04N 5/378* (2011.01)

(52) U.S. Cl.
CPC ........... *H04N 5/349* (2013.01); *H04N 5/3698* (2013.01); *H04N 5/37457* (2013.01); *H04N 9/0455* (2018.08); *H04N 5/378* (2013.01)

(58) Field of Classification Search
CPC ............. H04N 5/36961; H04N 5/3698; H04N 5/37457; H04N 5/378; H04N 9/0455; H04N 9/04555; H01L 27/14603; H01L 27/14641; H01L 27/14683
See application file for complete search history.

(56) References Cited

U.S. PATENT DOCUMENTS

| | | | |
|---|---|---|---|
| 9,490,281 B2 * | 11/2016 | Fukuda | H01L 27/14605 |
| 9,888,198 B2 * | 2/2018 | Mauritzson | H01L 27/14621 |
| 9,961,282 B2 | 5/2018 | Yamazaki | |
| 10,205,904 B2 | 2/2019 | Kobayashi | |
| 10,510,796 B1 * | 12/2019 | Wang | H01L 27/14634 |
| 10,594,961 B2 | 3/2020 | Hirota et al. | |
| 2013/0088621 A1 * | 4/2013 | Hamada | H04N 5/36961 |
| | | | 348/281 |
| 2016/0014358 A1 | 1/2016 | Itoh | |
| 2016/0141326 A1 * | 5/2016 | Hanzawa | H01L 27/14643 |
| | | | 250/208.1 |
| 2016/0286108 A1 * | 9/2016 | Fettig | H04N 9/04557 |
| 2017/0163873 A1 * | 6/2017 | Kim | H04N 5/23293 |
| 2018/0343404 A1 | 11/2018 | Hwang et al. | |

* cited by examiner

IMAGE SENSOR WITH PIXELS INCLUDING PHOTODIODES SHARING FLOATING DIFFUSION REGION

CROSS-REFERENCE TO RELATED APPLICATIONS

This application claims the benefit of Korean Patent Application Nos. 10-2019-0053242, filed on May 7, 2019 and 10-2019-0100535, filed on Aug. 16, 2019, in the Korean Intellectual Property Office, the collective subject matter of which is hereby incorporated by reference.

BACKGROUND

The inventive concept relates to image sensors, and more particularly, to image sensors including a plurality of pixels, wherein each pixel includes a plurality of subpixels including a photodiode.

Image sensors include a pixel array. Each pixel among the plurality of pixels in the pixel array may include a photodiode. Certain image sensors may perform an auto-focus (AF) function to improve the imaging accuracy of an object.

SUMMARY

The inventive concept provides an image sensor capable of accurately performing an auto-focus function across a range of illumination environments.

According to one aspect of the inventive concept, there is provided an image sensor selectively adapted for use in multiple resolution modes including a low resolution mode and a high resolution mode. The image sensor includes; a pixel array comprising a plurality of pixels, wherein each pixel in the plurality of pixels comprises a micro-lens, a first subpixel including a first photodiode, a second subpixel including a second photodiode, and the first subpixel and the second subpixel are adjacently disposed and share a floating diffusion region. The image sensor also includes a row driver configured to provide control signals to the pixel array to control performing of an auto focus (AF) function, such that performing the AF function includes performing the AF function according to pixel units in the high resolution mode and performing the AF function according to pixel group units in the low resolution mode. a resolution corresponding to the low resolution mode is equal to or less than ¼ times a resolution corresponding to the high resolution mode.

According to another aspect of the inventive concept, there is provided an image sensor selectively adapted for use in multiple resolution modes including a low resolution mode, a medium resolution mode and a high resolution mode. The image sensor includes a pixel array including a plurality of pixels arranged in a row direction and a column direction, wherein each pixel in the plurality of pixels has a shared pixel structure. The shared pixel structure includes; a first subpixel including a first photoelectric conversion element selectively transmitting photoelectric charge to a floating diffusion region via a first transmission transistor and in response to a first transmission signal, a second subpixel including a second photoelectric conversion element selectively transmitting photoelectric charge to the floating diffusion region via a second transmission transistor in response to a second transmission signal, a reset transistor configured to selectively reset photoelectric charge accumulated in the floating diffusion region in response to a reset signal, a driver transistor and a selection transistor selectively connecting the floating diffusion region to a pixel signal output in response to a selection signal, the floating diffusion region, reset transistor, driver transistor and selection transistor are shared by the first subpixel and the second subpixel and the first subpixel and the second subpixel are adjacently disposed. the image sensor also includes a row driver configured to provide the first transmission signal, the second transmission signal, the reset signal and the selection signal, such that performing of an auto focus (AF) function includes performing the AF function according to units of the plurality of pixels in the high resolution mode, performing the AF function according to units of pixels arranged in the same row in one pixel group in the medium resolution, and performing the AF function according to units of pixel groups in low resolution mode.

According to another aspect of the inventive concept, there is provided an image sensor selectively adapted for use in multiple resolution modes including a low resolution mode, a medium resolution mode and a high resolution mode. The image sensor includes; a controller configured to control the operation of a row driver and a signal read unit, and a pixel array comprising a plurality of pixels arranged in a row direction and a column direction and configured to provide a pixel signal in response to received incident light, wherein each pixel in the plurality of pixels comprises a micro-lens, a first subpixel including a first photodiode, a second subpixel including a second photodiode, and the first subpixel and the second subpixel are adjacently disposed and share a floating diffusion region, wherein the row driver is configured to provide control signals to the pixel array to control performing of an auto focus (AF) function, such that performing of an auto focus (AF) function includes performing the AF function according to units of the plurality of pixels in the high resolution mode, performing the AF function according to units of pixels arranged in the same row in one pixel group in the medium resolution, and performing the AF function according to units of pixel groups in low resolution mode.

BRIEF DESCRIPTION OF THE DRAWINGS

Embodiments of the inventive concept may be more clearly understood upon consideration of the following detailed description taken in conjunction with the accompanying drawings in which.

DETAILED DESCRIPTION

Figure 1:
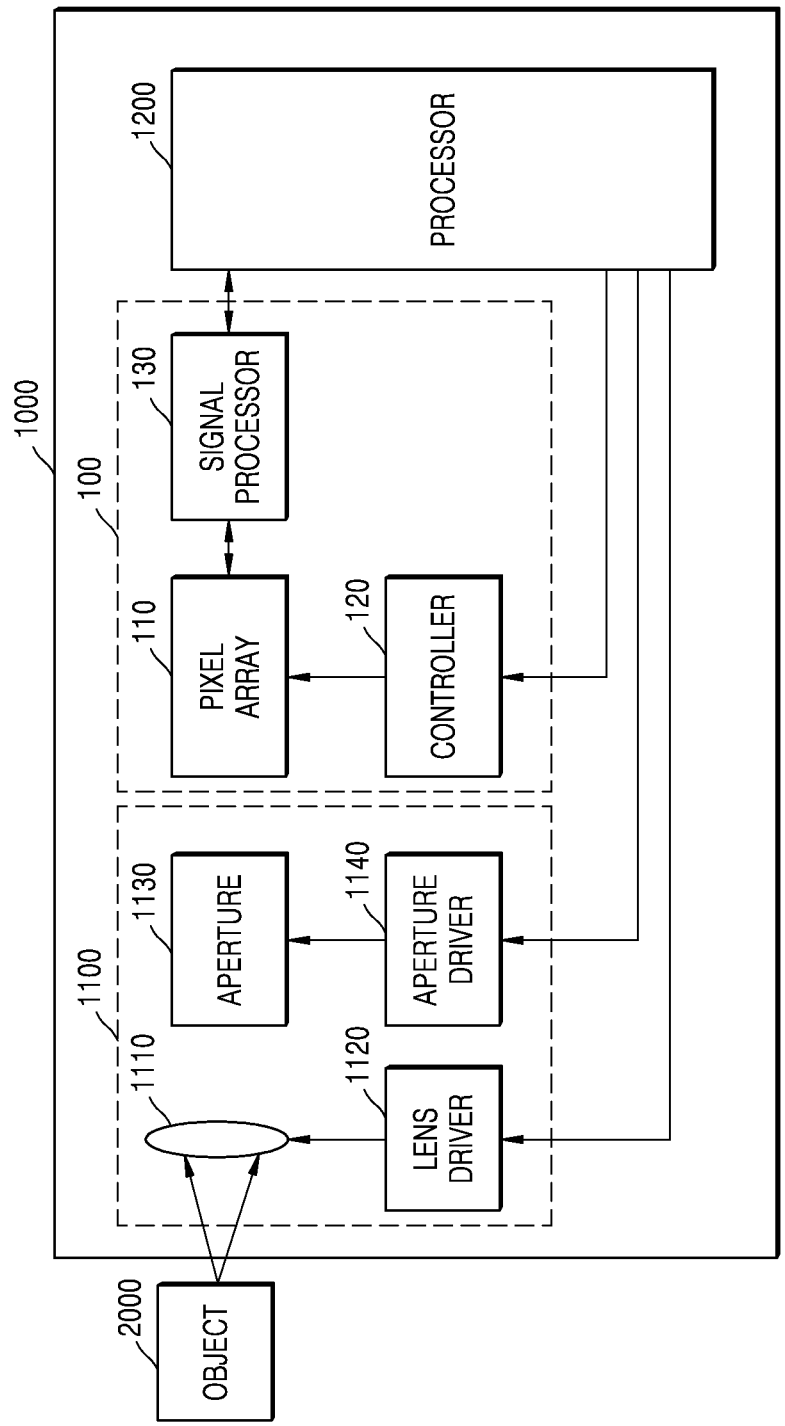
FIG. 1 is a block diagram illustrating a digital imaging device according to an embodiment of the inventive concept.

Figure (FIG. 1 is a block diagram illustrating a digital imaging device 1000 according to an embodiment of the inventive concept.

Referring to FIG. 1, the digital imaging device 1000 generally comprises an imaging unit 1100, an image sensor 100, and a processor 1200. Here, it is assumed that the digital imaging device 1000 is capable of performing a focus detection function.

The overall operation of the digital imaging device 1000 may be controlled by the processor 1200. In the illustrated embodiment of FIG. 1, it is assumed that the processor 1200 provides certain signals controlling various components of the digital imaging device 1000. For example, the processor 1200 may provide a lens driver signal applied to a lens driver 1120, an aperture driver signal applied to an aperture driver 1140, and a controller signal applied to a controller 120.

The imaging unit 1100 generally includes one or more element(s) configured to receiving incident light associated with an object 2000 being imaged by the digital imaging device. In this regard, the object 2000 may be a single object, a collection of objects, or a distributed field of object. Further in this regard, the term "incident light" should be broadly construed to mean any selected range of electromagnetic energy across one or more bands of the electromagnetic spectrum (e.g., wavelengths discernable to the human eye) capable of being imaged by the digital imaging device 1000.

In the illustrated embodiment of FIG. 1, the imaging unit 1100 includes the lens driver 1120 and aperture driver 1140, as well as a lens 1110 and an aperture 1130. Here, the lens 1110 may include one or more lenses arranged singularly or in combination to effectively capture the incident light associated with the object 2000.

In particular, the lens driver 1120 operates to control the operation of the lens 1110 to accurately capture the incident light associated with the object 2000. Accordingly, the lens driver 1120 is responsive to the focus detection function performed by the digital imaging device 1000, as may be transmitted to the lens driver 1120 by the processor 1200. In this manner, the focal position of the lens 1110 may be controlled by one or more control signals provided from the processor 1200.

In this regard, it should be noted that the term "control signal" is used hereafter to denote one or more signal(s), whether analog or digital in nature and having various formats, that are used to adjust or control the operation of a component within the digital imaging device 1000.

Thus, the lens driver 1120 may adjust the focal position of the lens 1110 with respect to the movement, orientation and/or distance of the object 2000 relative to the lens 1110 in order to correct focal mismatches between a given focal position of the lens 1110 and the object 2000.

Within the illustrated embodiment of FIG. 1, the image sensor 100 may be used to convert incident light received via the imaging unit 1100 into a corresponding image signal. The image sensor 100 may generally include a pixel array 110, the controller 120, and a signal processor 130. Here, incident light passing through the lens 1110 and the aperture 1130 reaches an incident light receiving surface of the pixel array 110.

The pixel array 110 may include a Complementary Metal Oxide Semiconductor (CMOS) image sensor (CIS) capable of converting the energy of the incident light into corresponding electrical signal(s). In this regard, the sensitivity of the pixel array 110 may be adjusted by the controller 120. The resulting collection of corresponding electrical signal(s) may be further processed by the signal processor 130 to provide an image signal.

In certain embodiments of the inventive concept, the pixel array 110 may include a plurality of pixels selectively capable of performing an auto focus (AF) function or a distance measurement function.

Thus, in certain embodiments of the inventive concept, the processor 1200 may receive a first image signal and a second image signal from the signal processor 130 and perform a phase difference determination using the first image signal and the second image signal. The processor 1200 may then determine an appropriate focal position, identify a focus direction, and/or a calculate a distance between the digital imaging device and the object 2000 on the basis of a result of the phase difference determination. In this manner, the processor 1200 may be used to provide the signal(s) applied to the lens driver 1120 in order to properly adjust the focal position of the lens 1110 based on the results of the phase difference determination operation.

Figure 2:
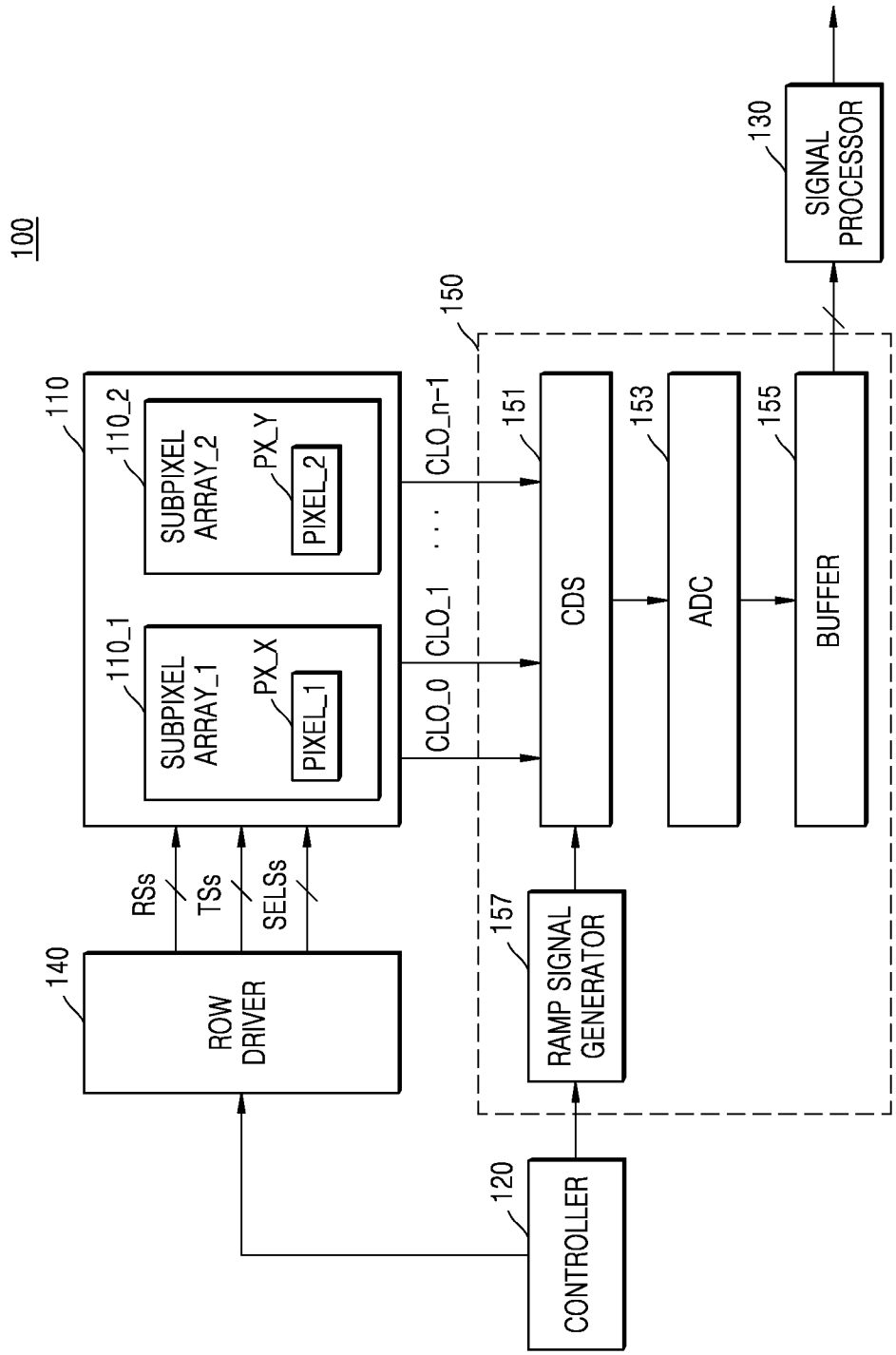
FIG. 2 is a block diagram further illustrating in one embodiment the image sensor 100 of FIG. 1.

FIG. 2 is a block diagram further illustrating in one embodiment the image sensor 100 of FIG. 1. Here, the image sensor 100 may be selectively adapted for use in various resolution modes in response to the illumination environment associated with the object 2000. That is, in certain embodiments of the inventive concept, the digital imaging device of FIG. 1 may make a determination regarding an appropriate resolution mode (e.g., low or high) and selectively adapted (or configure) the image sensor 100 accordingly.

Referring to FIG. 2, the image sensor 100 comprises a row driver 140 and a signal read unit 150 in addition to the pixel array 110, the controller 120 and the signal processor 130. Here, it is assumed that the signal read unit 150 includes a correlated-double sampling circuit (CDS) 151, an analog-to-digital converter (ADC) 153 and a buffer 155.

The pixel array 110 comprises a plurality of pixels. This plurality of pixels may be variously designated for operation (or functionally divided) into one or more subpixel arrays. For example, the pixel array 110 may include a first subpixel array 110_1 and a second subpixel array 110_2. In certain embodiments of the inventive concept, the first subpixel array 110_1 includes a plurality of horizontal pixels PX_X capable of performing an AF function in a first direction (e.g., a row direction), and the second subpixel array 110_2 includes a plurality of vertical pixels PX_Y capable of performing an AF function in a second direction (e.g., a column direction). In certain embodiments of the inventive concept each subpixel array may be further, functionally divided into two (2) or more pixel groups.

Those skilled in the art will recognize that the terms "horizontal" and "vertical"; "first direction" and "second direction", as well as "row direction" and "column direction" are relative in nature, and are used to describe various, relative orientation relationships between recited elements and components.

Each horizontal pixel PX_X of the first subpixel array 110_1 includes at least two (2) photodiodes adjacently disposed in the first (or row) direction of a matrix arrangement including at least one row. Each horizontal pixel PX_X of the first subpixel array 110_1 also includes a micro-lens ML disposed on the at least two (2) photodiodes.

Each vertical pixels PX_Y of the second subpixel array 110_2 includes at least two (2) photodiodes adjacently disposed in the second (or column) direction of a matrix including at least one column. Each vertical pixel PX_Y of the second subpixel array 110_2 also includes a micro-lens ML disposed on the at least two (2) photodiodes.

With this configuration, each of the horizontal pixel PX_X of the first subpixel array 110_1 may perform an AF function in the first direction, and each vertical pixel PX_Y of the second subpixel array 110_2 may perform an AF function in the second direction. Since each of the horizontal pixels PX_X and each of the vertical pixels PX_Y includes at least two photodiodes as well as a micro-lens, each one of the plurality of pixels (including both horizontal PX_X pixels and vertical PX_Y pixels) may generate a pixel signal capable of effectively performing an AF function. In this manner, an image sensor according to an embodiment of the inventive concept may readily provide an enhanced AF function.

In certain embodiments of the inventive concept, the width of each horizontal pixel PX_X of the first subpixel array 110_1 may range from between about 0.5 µm and about 1.8 µm. The width of each vertical pixel PX_Y of the second subpixel array 110_2 may also range from between about 0.5 µm and about 1.8 µm. Alternatively, the width of the plurality of horizontal and vertical pixels, PX_X and PX_Y, may range from between about 0.64 µm and about 1.4 µm.

In certain embodiments of the inventive concept, the horizontal pixels PX_X of the first subpixel array 110_1 may be grouped into one or more pixel groups, and the vertical pixels PX_Y of the second subpixel array 110_2 may be grouped into one or more pixel groups.

According to a given configuration and definition of a plurality of pixels and pixel groups, the image sensor 100 of FIG. 2 may selectively perform an AF function according using pixels units or according to pixel group units. For example, given the digital imaging device 1000 of FIG. 1 is adapted for use in a high resolution mode, the image sensor may perform an AF function according to pixel units (i.e., in response to various pixel signal(s) provided by individual pixels—e.g., horizontal and/or vertical pixels). Alternately, given the digital imaging device 1000 of FIG. 1 is adapted for use in a low resolution mode, the image sensor may perform an AF function according to pixel group units (i.e., in response to various pixel signal(s) provided by pixel groups).

Respective embodiments further illustrating possible configurations for the first and second subpixel arrays 110_1 and 110_2 will be described hereafter with reference to FIGS. 3A and 3B.

Returning to FIG. 2, each pixel in the pixel array 110 may respectively output a pixel signal (see e.g., the VOUT signal of FIG. 5) to the CDS 151 through one of the first through n-1$^{th}$ column output lines CLO_0 to CLO_n−1. Pixel signals output from the horizontal pixels PX_X of the first subpixel array 110_1 and the vertical pixels PX_Y of the second subpixel array 110_2 may be phase signals used to calculate a phase difference. The phase signals may include information associated with the positioning of object(s) imaged by the image sensor 100. Accordingly, a focus position for the lens 1110 (of FIG. 1) may be calculated in response to the calculated phase difference(s). For example, a focus position for the lens 1110 corresponding to a phase difference of '0' may be deemed an optimal focus position. In certain embodiments of the inventive concept, given operation in the high resolution mode, a selected plurality of pixels (e.g., including both horizontal and vertical pixels, PX_X and PX_Y) may from the pixel array 110 may be used to perform an AF function. Indeed, in certain embodiment all of the horizontal pixels in the first subpixel array 110_1 and all of the vertical pixels in the second subpixel array 110_2 may collectively be used to perform the AF function when the digital imaging device 100 is being operated in the high resolution mode.

Additionally or alternatively, the horizontal pixels PX_X of the first subpixel array 110_1 and the vertical pixels PX_Y of the second subpixel array 110_2 may be used to measure a distance between the object 2000 and the digital imaging device 1000. In order to measure a distance between the digital imaging device 100 and the object 2000, some additional information may be necessary or convenient to use. Examples of additional information may include: phase difference between the object 2000 and the image sensor 100, lens size for the lens 1110, current focus position for the lens 1110, etc.

In the embodiment illustrated in FIG. 2, the controller 120 may be used to control the row driver 140, such that the pixel array 110 effectively captures incident light to effectively accumulate corresponding photoelectric charge (or temporarily store the accumulated photoelectric charge). Here, the term "photoelectric charge" is used to denote electrical charge generated by at least one subpixel in the pixel array in response to incident light. The pixel array may then output an electrical signal (i.e., a pixel signal) corresponding to the accumulated photoelectrical charge. Additionally, the controller 120 may control the operation of the signal read unit 150, such that the pixel array 110 may accurately measure a level of the pixel signal provided by the pixel array 110.

The row driver 140 may be used to generate various control signals. Here, examples of control signals include; reset control signals RS, transmission control signals TS, and selection signals SELS that may be variously provided to control the operation of the pixel array 110. Those skilled in the art will recognize that the choice, number and definition of various control signals is a matter of design choice.

In certain embodiments of the inventive concept, the row driver 140 may be used determine the activation timing and/or deactivation timing (hereafter, singularly or collectively in any pattern, "activation/deactivation") of the reset control signals RS, transmission control signals TS, and selection signals SELS variously provided to the horizontal pixels PX_X of the first subpixel array 110_1 and the vertical pixels PX_Y of the second subpixel array 110_2, in response to various factors, such as high/low resolution mode of operation, types of AF function being performed, distance measurement function, etc.

The CDS 151 may sample and hold a pixel signal provided from the pixel array 110. The CDS 151 may doubly sample a level of certain noise and a level based on the pixel signal to output a level corresponding to a difference therebetween. Moreover, the CDS 151 may receive a ramp signal generated by a ramp signal generator 157 and may compare the ramp signal with the pixel signal to output a comparison result. The ADC 153 may convert an analog signal, corresponding to the level received from the CDS 151, into a digital signal. The buffer 155 may latch the digital signal, and the latched digital signal may be sequentially output to the outside of the signal processor 130 or the image sensor 100.

The signal processor 130 may perform signal processing on the basis of the digital signal received from the buffer 155. For example, the signal processor 130 may perform noise decrease processing, gain adjustment, waveform standardization processing, interpolation processing, white balance processing, gamma processing, edge emphasis processing, etc. Moreover, the signal processor 130 may output information, obtained through signal processing performed in an AF operation, to the processor 1200 to allow the processor 1200 to perform a phase difference operation needed for the AF operation. In an embodiment, the signal processor 130 may be included in a processor (1200 of FIG. 1) provided outside the image sensor 100.

Figure 3A:
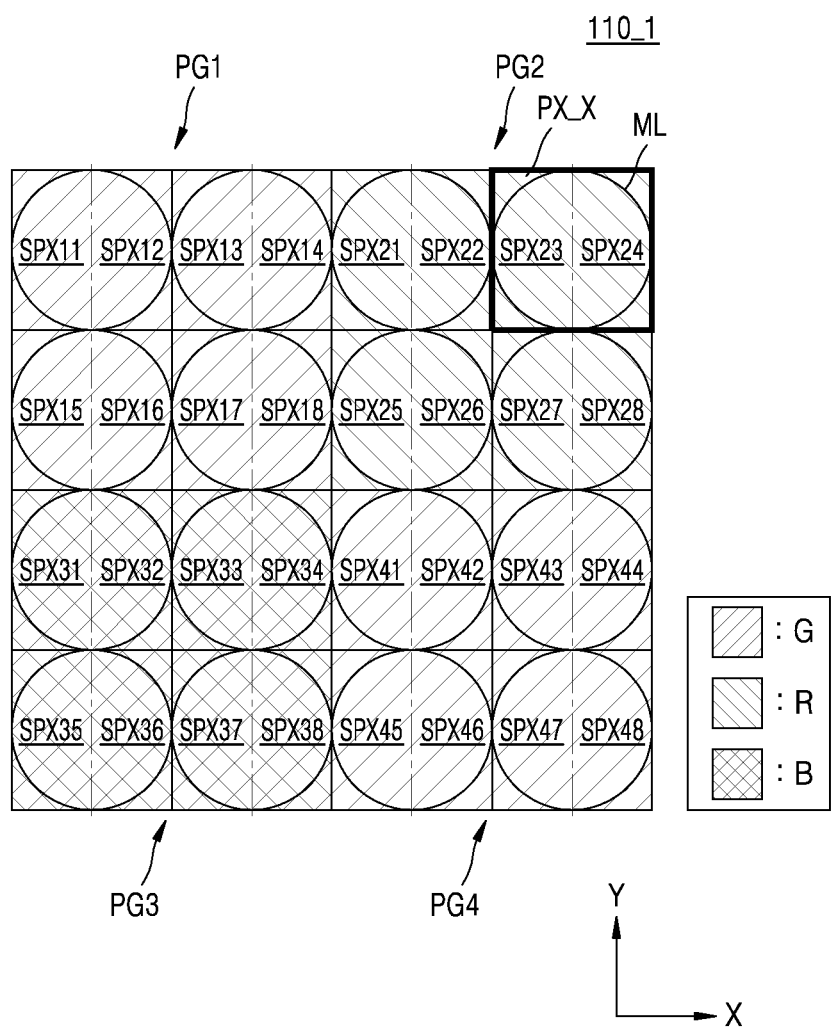
FIGS. 3A, 3B, 4A, 4B and 4C are respective diagrams further illustrating certain aspects of the pixel array 110 of the image sensor 100 of FIG. 2.
Figure 3B:
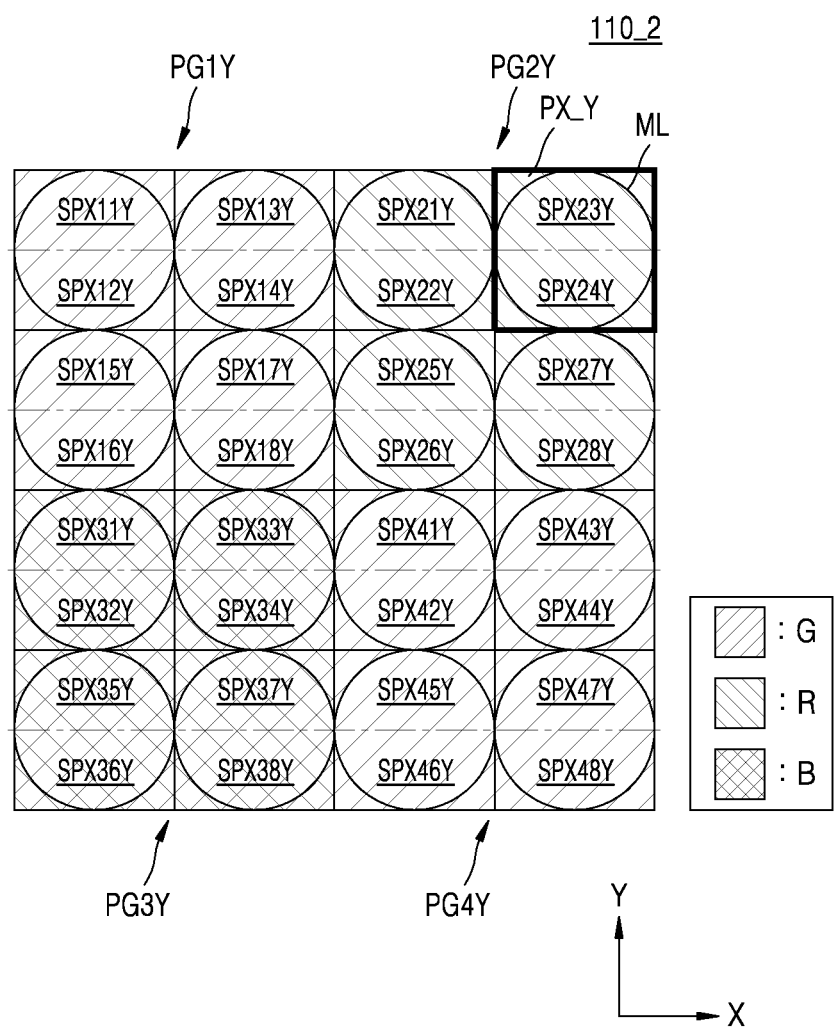

FIGS. 3A and 3B are respective diagrams further illustrating in certain embodiments the pixel array 110 of FIG. 2. FIG. 3A is a diagram further illustrating in one embodiment the first subpixel array 110_1 of the pixel array 110, and FIG. 3B is a diagram further illustrating in another embodiment the second subpixel array 110_2 of the pixel array 110.

Referring to FIG. 3A, the first subpixel array 110_1 includes a plurality of horizontal pixels PX_X arranged in a matrix defined according to a row direction (i.e., a first direction X) and a column direction (i.e., a second direction Y). Each of the horizontal pixels PX_X in the first subpixel array 110_1 may include a micro-lens ML.

In the illustrated example of FIG. 3A, the first subpixel array 110_1 includes first to fourth pixel groups PG1, PG2, PG3 and PG4, wherein the first pixel group PG1 and the second pixel group PG2 are adjacently disposed in the first direction X, while the third pixel group PG3 and the fourth pixel group PG4 are adjacently disposed in the first direction X. The first pixel group PG1 and the third pixel group PG3 are adjacently disposed in the second direction Y, while the second pixel group PG2 and the fourth pixel group PG4 are adjacently disposed in the second direction Y.

In the illustrated embodiment of FIG. 3A, each of the first, second, third and fourth pixel groups PG1 to PG4 includes four (4) horizontal pixels PX_X, but other embodiments of the inventive concept are not limited to this configuration. For example, each of the first, second, third and fourth pixel groups PG1 to PG4 may include eight (8) horizontal pixels PX_X arranged in two (2) rows and four (4) columns.

Here, however, the first pixel group PG1 includes first to eighth subpixels SPX11 to SPX18, where first subpixel SPX11 and second subpixel SPX12 are configured in one horizontal pixel PX_X, third subpixel SPX13 and fourth subpixel SPX14 are configured in another horizontal pixel PX_X, fifth subpixel SPX15 and sixth subpixel SPX16 are configured in another horizontal pixel PX_X, and seventh subpixel SPX17 and eighth subpixel SPX18 are configured in still another horizontal pixel PX_X.

With analogous configurations, the second pixel group PG2 includes first to eighth subpixels SPX21 to SPX28; the third pixel group PG3 includes first to eighth subpixels SPX31 to SPX38; and the fourth pixel group PG4 includes first to eighth subpixels SPX41 to SPX48.

Here, it should be noted that each horizontal pixel PX_X includes two (2) subpixels adjacently disposed to each other in the first direction X.

The first subpixel array 110_1 may further include one or more color filter(s), such that respective horizontal pixels, respective collection(s) of horizontal pixels and/or respective pixel groups may selectively sense various light wavelengths, such as those conventionally associated with different colors of the visible light spectrum. For example, in certain embodiments of the inventive concept, various color filter(s) associated with the first subpixel array 110_1 may include a red filter (R) for sensing red, a green filter (G) for sensing green, and a blue filter (B) for sensing blue. That is, various color filters (e.g., a first color filter, a second color filter, etc.) may be respectively selected from a group of color filters including; a red filter, a blue filter, a green filter, a white filter, a yellow filter, etc.

Here, each of the first, second, third and fourth pixel groups PG1 to PG4 may variously associated with one or more color filters.

In one embodiment of the inventive concept consistent with the configuration shown in FIG. 3A, the first, second, third and fourth pixel groups PG1 to PG4 may be disposed in the first subpixel array 110_1 according to a Bayer pattern. That is, the first pixel group PG1 and the fourth pixel group PG4 may associated with a green filter (G), the second pixel group PG2 may associated with a red filter (R), and the third pixel group PG3 may be associated with a blue filter (B).

However, the foregoing embodiment of the first subpixel array 110_1 is just one example of many different configurations wherein a color filter is variously associated with one or more pixels selected from one or more pixel groups. Additionally or alternatively, embodiments of the inventive concept may variously include; a white filter, a yellow filter, a cyan filter, and/or a magenta filter.

With reference to FIG. 3A, each of the subpixels SPX11 to SPX18, SPX21 to SPX28, SPX31 to SPX38, and SPX41 to SPX48 included in the first subpixel array 110_1 may include a corresponding photodiode. Thus, each of the horizontal pixels PX_X will include at least two (2) photodiodes adjacently disposed to each other in the first direction X. A micro-lens ML may be disposed on the at least two (2) photodiodes.

With this exemplary configuration in mind, the amount of photoelectric charge generated by the at least two (2) photodiodes included in each horizontal pixel PX_X will vary with the shape and/or refractive index of an associated micro-lens ML. Accordingly, an AF function performed in the first direction X may be based on a pixel signal corresponding to the amount of photoelectric charge generated by the constituent, at least two (2) photodiodes.

For example, an AF function may be performed by using a pixel signal output by the first subpixel SPX11 of the first pixel group PG1 and a pixel signal output by the second subpixel SPX12 of the first pixel group PG1. Accordingly, an image sensor according to an embodiment of the inventive concept may selectively perform an AF function according to pixel units in a first operating (e.g., a high resolution) mode. The performance of an AF function according to "pixel units" in a high resolution mode allows for the selective use of one, more than one, or all of the horizontal pixels PX_X in the first subpixel array 110_1 during the performance of an AF function.

By way of comparison, an image sensor according to an embodiment of the inventive concept may selectively perform an AF function according to pixel group units in a second operating (e.g., a low resolution) mode. The performance of an AF function according to "pixel group units" in a low resolution mode allows for the selective use of one, more than one, or all of the pixel groups (e.g., PG1, PG2, PG3 and PG4) in the first subpixel array 110_1 during the performance of an AF function. For example, an AF function may be performed by processing a first pixel signal corresponding to the amount of photoelectric charge generated by a photodiode of each of the first subpixel SPX11, the third subpixel SPX13, the fifth subpixel SPX15, and the seventh subpixel SPX17 of the first pixel group PG1 and a second pixel signal corresponding to the amount of photoelectric charge generated by a photodiode of each of the second subpixel SPX12, the fourth subpixel SPX14, the sixth subpixel SPX16, and the eighth subpixel SPX18 of the first pixel group PG1. Given this selective approach to performing an AF function by the image sensor 100, and even in environmental circumstances wherein a relatively low level incident light is captured by the pixel array 110 (e.g., a level of incident light conventional inadequate to accurately perform an AF function), an image sensor according to an embodiment of the inventive concept may nonetheless faithfully perform the AF function.

In this regard, those skilled in the art will recognize that the terms "high resolution" and "low resolution" are relative terms and may be arbitrarily defined according to design. However, in the context of certain embodiments of the inventive concept, a first level of image resolution associated with a low resolution mode may be understood as being less than or equal to ¼ of a second level of image resolution associated with a high resolution mode.

With the foregoing in mind, other embodiments of the inventive concept may provide digital imaging devices capable of operating (or selectively adapted for use) in more than two resolution modes. For example, a digital imaging device according to certain embodiments of the inventive concept may be selectively adapted for use in a low resolution mode and a high resolution mode, as described above, and additionally in a medium resolution mode. Here, for example, an image sensor according to embodiments of the inventive concept may perform an AF function according to pixel units by selecting a set of horizontal pixels PX_X (or a set of vertical pixels PX_Y) included in a single pixel group (e.g., PG1) and arranged in a same row (or the same column).

Extending this example, an AF function may be performed by processing a first pixel signal corresponding to an amount of photoelectric charge generated by the photodiodes of each of the first subpixel SPX11 and the third subpixel SPX13 of the first pixel group PG1, and a second pixel signal corresponding to the amount of photoelectric charge generated by a photodiode of each of the second subpixel SPX12 and the fourth subpixel SPX14 of the first pixel group PG1. Alternatively, an AF function may be performed by processing a first pixel signal corresponding to an amount of photoelectric charge generated by a photodiode of each of the first subpixel SPX11 and the fifth subpixel SPX15 of the first pixel group PG1 and a second pixel signal corresponding to an amount of photoelectric charge generated by a photodiode of each of the second subpixel SPX12 and the sixth subpixel SPX16 of the first pixel group PG1.

Recognizing here again that the terms "high resolution", "medium resolution", and "low resolution" are relative terms, and may be arbitrarily defined according to design, in the context of certain embodiments of the inventive concept, a third level of image resolution associated with the medium resolution mode may be understood as being greater than ¼ of a second level of image resolution associated with a high resolution mode, but less than ½ of the second level of the image resolution associated with the high resolution mode.

Referring to FIG. 3B, the second subpixel array 110_2 includes a plurality of vertical pixels PX_Y arranged in a matrix defined in relation to the first direction X and the second direction Y. In certain embodiments, each of the vertical pixels PX_Y may include a single micro-lens ML.

As shown in FIG. 3B, the second subpixel array 110_2 includes first, second, third and fourth pixel groups PG1Y to PG4Y. However, other embodiments of the inventive concept may include less or more pixel groups. Here, the first pixel group PG1Y includes first to eighth subpixels SPX11Y to SPX18Y. The first subpixel SPX11Y and the second subpixel SPX12Y are configured as one vertical pixel PX_Y, the third subpixel SPX13Y and the fourth subpixel SPX14Y are configured as another vertical pixel PX_Y, the fifth subpixel SPX15Y and the sixth subpixel SPX16Y are configured as another vertical pixel PX_Y, and the seventh subpixel SPX17Y and the eighth subpixel SPX18Y are configured as still another vertical pixel PX_Y. Moreover, for example, the second pixel group PG2Y may include first to eighth subpixels SPX21Y to SPX28Y, the third pixel group PG3Y may include first to eighth subpixels SPX31Y to SPX38Y, and the fourth pixel group PG4Y may include first to eighth subpixels SPX41Y to SPX48Y. That is, one pixel PX_Y may include two subpixels disposed adjacent to each other in the second direction Y.

The respective vertical pixels of the second subpixel array 110_2 or various collections of the respective vertical pixels of the second subpixel array 110_2 may be variously associated with one or more color filter(s), as described above in relation to FIG. 3A.

Thus, each of the subpixels SPX11Y to SPX18Y, SPX21Y to SPX28Y, SPX31Y to SPX38Y, and SPX41Y to SPX48Y included in the second subpixel array 110_2 may include one corresponding photodiode. Therefore, each of the vertical pixels PX_Y will include at least two (2) photodiodes adjacently disposed to each other in the second direction Y. The amount of photoelectric charge generated by the at least two (2) photodiodes included in a vertical pixel PX_Y may vary with the shape and/or the refractive index of the associated micro-lens ML. An AF function in the second direction Y may be performed based on a pixel signal corresponding to the amount of photoelectric charge generated by photodiodes included in one pixel PX_Y. For example, an AF function may be performed by using a first pixel signal output by the first subpixel SPX11Y of the first pixel group PG1Y and a second pixel signal output by the second subpixel SPX12Y of the first pixel group PG1Y. Therefore, the image sensor according to an embodiment may perform an AF function according to pixel units in the high resolution mode.

On the other hand, an image sensor according to embodiments of the inventive concept may perform an AF function according to pixel groups in the low resolution mode. For example, an AF function in the second direction Y may be performed by processing a first pixel signal corresponding to an amount of photoelectric charge generated by a photodiode of each of the first subpixel SPX11Y, the third subpixel SPX13Y, the fifth subpixel SPX15Y, and the seventh subpixel SPX17Y of the first pixel group PG1Y, and a second pixel signal corresponding to an amount of photoelectric charge generated by a photodiode of each of the second subpixel SPX12Y, the fourth subpixel SPX14Y, the sixth subpixel SPX16Y, and the eighth subpixel SPX18Y of the first pixel group PG1Y.

Analogously with the foregoing description of the embodiment of FIG. 3A, the embodiment of FIG. 3B may be altered to operate in a medium resolution mode, as well as the high resolution mode and the low resolution mode.

Figure 4A:
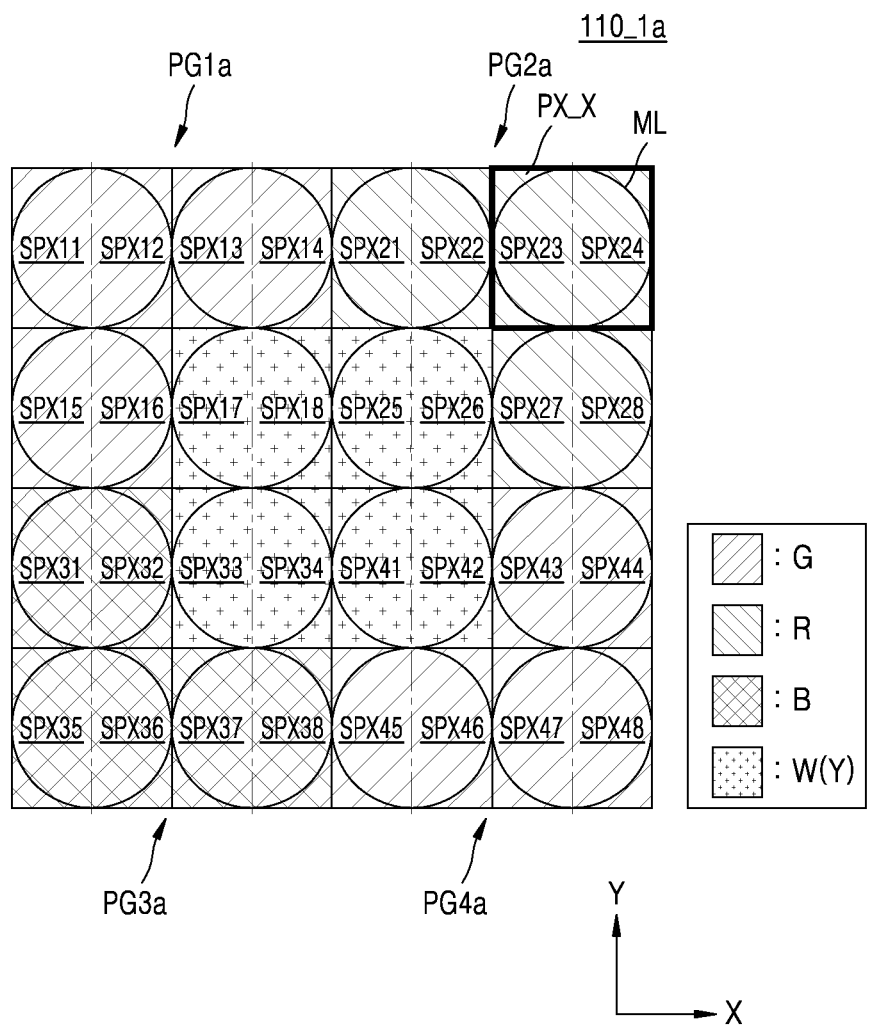
Figure 4B:
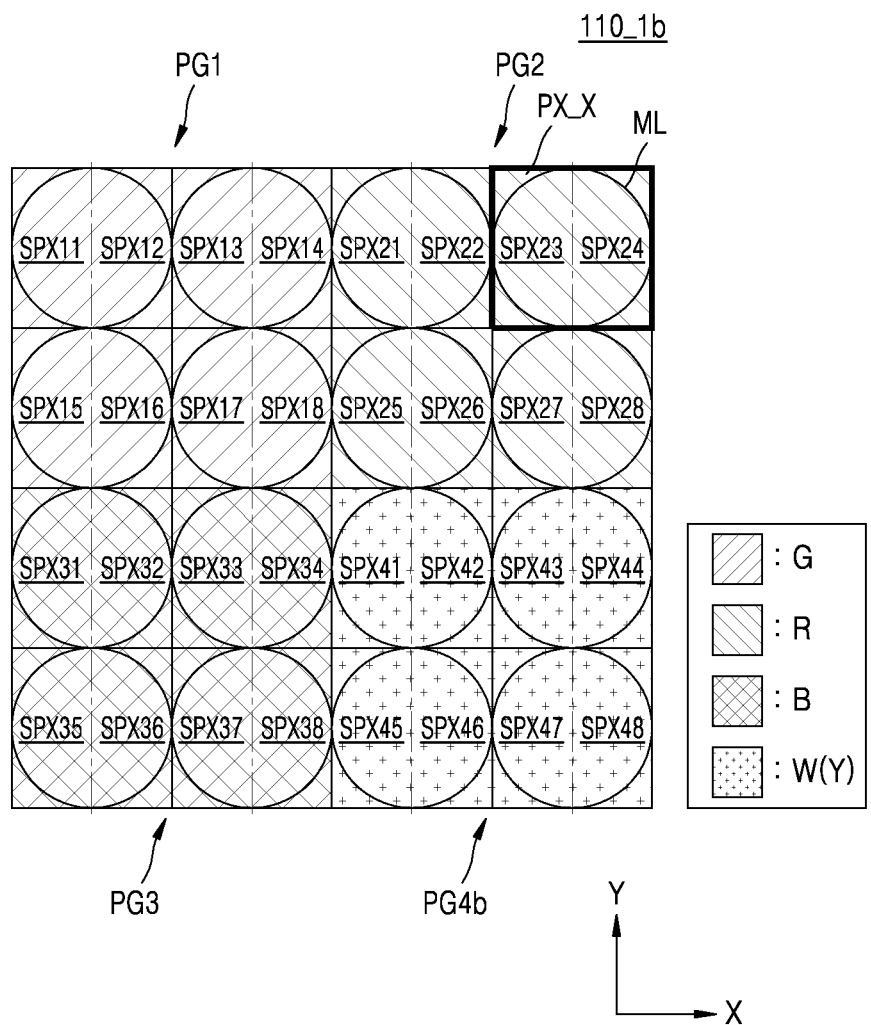
Figure 4C:
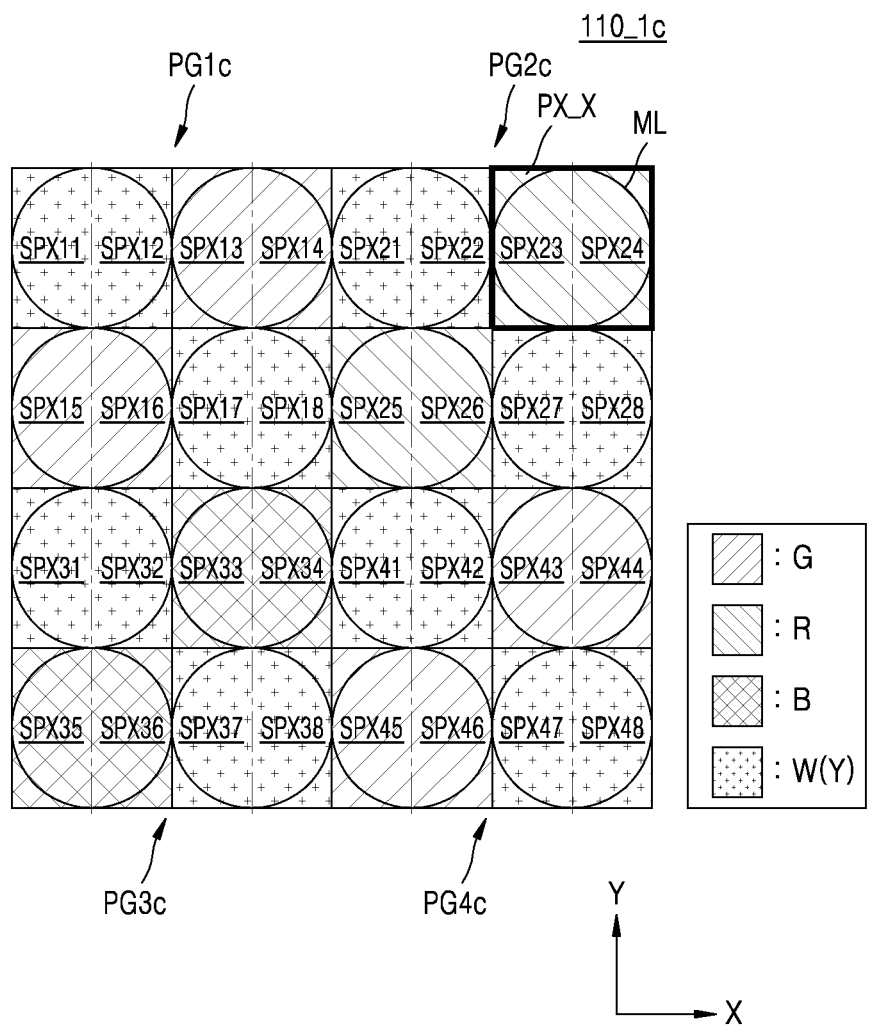

FIGS. 4A, 4B and 4C are respective diagrams further illustrating in various embodiments the pixel array 110 of the image sensor 100 of FIG. 2. Here, like reference numbers and labels are used among FIGS. 3A, 4A, 4B and 4C.

Referring to FIG. 4A, the horizontal pixels PX_X of a first subpixel array 110_1a are variously associated with (i.e., functionally configured together with) different color filters; a red filter (R), a green filter (G), a blue filter (B) and a white (or yellow) filter (W) or (Y). Here again, first, second third, and fourth pixel groups PG1a to PG4a are assumed for the first subpixel array 110_1a.

In FIG. 4A, both the first pixel group PG1a and the fourth pixel group PG4a have horizontal pixels PX_X variously associated with a green filter (G) and a white filter (W). That is, a seventh subpixel SPX17 and an eighth subpixel SPX18 of the first pixel group PG1a are associated with the white filter (W), and a first subpixel SPX41 and a second subpixel SPX42 of the fourth pixel group PG4a are associated with the white filter (W). Alternatively, the horizontal pixels PX_X of the first pixel group PG1a and the fourth pixel group PG4a might be associated with the green filter (G) and a yellow filter (Y).

Analogously, horizontal pixels PX_X of the second pixel group PG2a are variously associated with the red filter (R) and the white filter (W). That is, a fifth subpixel SPX25 and a sixth subpixel SPX26 of the second pixel group PG2a are associated with the white filter (W) or alternately the yellow filter (Y), and horizontal pixels PX_X of the third pixel group PG3a are variously associated with the blue filter (B) and the white filter (W). That is, a third subpixel SPX33 and a fourth subpixel SPX34 of the third pixel group PG3a are associated with the white filter (W) or alternately the yellow filter (Y).

Thus, as illustrated in FIG. 4A certain embodiments of the inventive concept may associate adjacent horizontal pixels PX_X selected from different pixel groups with a color filter, while non-selected horizontal pixels PX_X from each of the different pixel groups are variously associated with different color filters.

In contrast and as illustrated in FIG. 4B, respective pixel groups (e.g., first to fourth pixel groups PG1b to PG4b) may be respectively associated with one of a set of color filters. For example, the first pixel group PG1b is associated with the green filter (G), the second pixel group PG2b is associated with the red filter (R), the third pixel group PG3b is associated with the blue filter (B), and the fourth pixel group PG4b is associated with the white filter (W) or the yellow filter (Y).

In further contrast and as illustrated in FIG. 4C, each individual horizontal pixel PX_X may be respectively associated with a selected one of the set of color filters, without regard to inclusion of the individual horizontal pixel PX_X in a particular pixel group. Thus, each one of the first to fourth pixel groups PG1c to PG4c includes color filters having different colors.

As illustrated in FIG. 4C, the first pixel group PG1c and the fourth pixel group PG4c include a green filter (G) and a white filter (W) or a yellow filter (Y). The first, second, seventh, and eighth subpixels SPX11, SPX12, SPX17, and SPX18 of the first pixel group PG1c are associated with the white filter (W) or the yellow filter (Y), whereas the first, second, seventh, and eighth subpixels SPX41, SPX42, SPX47, and SPX48 of the fourth pixel group PG4c are associated with the white filter (W) or the yellow filter (Y). Moreover, the third, fourth, fifth, and sixth subpixels SPX13, SPX14, SPX15, and SPX16 of the first pixel group PG1c are associated with the green filter (G), whereas the third, fourth, fifth, and sixth subpixels SPX43, SPX44, SPX45, and SPX46 of the fourth pixel group PG4c are associated with the green filter (G).

The second pixel group PG2c includes horizontal pixels PX_X variously associated with the red filter (R) and the white filter (W) or the yellow filter (Y). Hence, the first, second, seventh, and eighth subpixels SPX21, SPX22, SPX27, and SPX28 of the second pixel group PG2c are each associated with the white filter (W) or the yellow filter (Y), whereas the third, fourth, fifth, and sixth subpixels SPX23, SPX24, SPX25, and SPX26 of the second pixel group PG2c are associated with the red filter (R).

The third pixel group PG3c includes horizontal pixels PX_X variously associated with the blue filter (B) and the white filter (W) or the yellow filter (Y). Hence, the first, second, seventh, and eighth subpixels SPX31, SPX32, SPX37, and SPX38 of the third pixel group PG3c are associated with the white filter (W) or the yellow filter (Y), whereas the third, fourth, fifth, and sixth subpixels SPX33, SPX34, SPX35, and SPX36 of the third pixel group PG3c are each associated with the blue filter (B).

Figure 5:
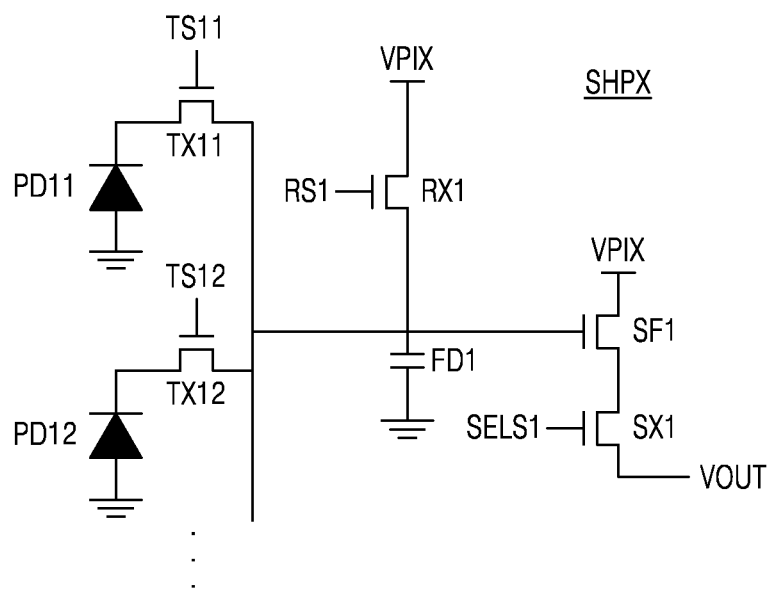
FIG. 5 is a circuit diagram illustrating in one embodiment an arrangement of first and second subpixels sharing a floating diffusion region.

FIG. 5 is a circuit diagram illustrating an arrangement of first and second subpixels sharing a floating diffusion region according to certain embodiments of the inventive concept. In FIG. 5, a first subpixel and a second subpixel of a pixel (e.g., a horizontal pixel or a vertical pixel) are configured within a shared pixel structure to share a floating diffusion region. However, other embodiments of the inventive concept may include other arrangements of various subpixels sharing a floating diffusion region.

In FIG. 5, the first subpixel includes a first photodiode PD11, a first transmission transistor TX11, a selection transistor SX1, a drive transistor SF1, and a reset transistor RX1. The second subpixel includes a second photodiode PD12, a second transmission transistor TX12, as well as the selection transistor SX1, the drive transistor SF1, and the reset transistor RX1. With this configuration (e.g., a shared pixel structure SHPX), the first subpixel and the second subpixel may effectively share a floating diffusion region FD1 as well as the selection transistor SX1, the drive transistor SF1, and the reset transistor RX1. Those skilled in the art will recognize that one or more of the selection transistor SX1, the drive transistor SF1, and the reset transistor RX1 may be omitted in other configurations.

Here, each of the first photodiode PD11 and the second photodiode PD12 may generate photoelectric charge as a function of received incident light. For example, each of the first photodiode PD11 and the second photodiode PD12 may be a P-N junction diode that generates photoelectric charge (i.e., an electron as a negative photoelectric charge and a hole as a positive photoelectric charge) in proportion to an amount of incident light. That is, each of the first photodiode PD11 and the second photodiode PD12 may include at least one photoelectric conversion element, such as a phototransistor, a photogate, a pinned photodiode (PPD), etc.

The first transmission transistor TX11 may be used to transmit photoelectric charge generated by the first photodiode PD11 to the floating diffusion region FD1 in response to a first transmission control signal TS11 applied to the first transmission transistor TX11. Thus, when the first transmission transistor TX11 is turned ON, photoelectric charge generated by the first photodiode PD11 is transmitted to the floating diffusion region FD1 wherein it is accumulated (or stored) in the floating diffusion region FD1. Likewise, when the second transmission transistor TX12 is turned ON in response to a second transmission control signal TS12, photoelectric charge generated by the second photodiode PD12 is transmitted to, and is accumulated by, the floating diffusion region FD1.

In this regard, the floating diffusion region FD1 operates as a photoelectric charge capacitor. Thus, as the number of photodiodes operationally connected to the floating diffusion region FD1 increases in certain embodiments of the inventive concept, capacitance storing capability of the floating diffusion region FD1 must also increase.

The reset transistor RX1 may be used to periodically reset the photoelectric charge accumulated in the floating diffusion region FD1. A source electrode of the reset transistor RX may be connected to the floating diffusion region FD1, and a drain electrode thereof may be connected to a source voltage VPIX. When the reset transistor RX is turned ON in response to a reset control signal RS1, the source voltage VPIX connected to the drain electrode of the reset transistor RX1 may be applied to the floating diffusion region FD1. When the reset transistor RX1 is turned ON, photoelectric charge accumulated in the floating diffusion region FD1 may be discharged, and thus, the floating diffusion region FD1 may be reset.

The drive transistor SF1 may be controlled based on the amount of photoelectric charge accumulated in the floating diffusion region FD1. The drive transistor SF1 may be a buffer amplifier and may buffer a signal in response to the photoelectric charge accumulated by the floating diffusion region FD1. The drive transistor SF1 may amplify a potential varying in the floating diffusion region FD1, and output the amplified potential as a pixel signal VOUT to a column output line (e.g., one of the first to $n-1^{th}$ column output lines CLO_0 to CLO_n−1 of FIG. 2).

A drain terminal of the selection transistor SX1 may be connected to a source terminal of the drive transistor SF1, and in response to a selection signal SELS1, the selection transistor SX1 may output the pixel signal VOUT to a CDS (e.g., the CDS 151 of FIG. 2) through a corresponding column output line.

One or more of the first transmission control signal TS11, the second transmission control signal TS12, the reset control signal RS1, and the selection signal SELS1, as illustrated in FIG. 5, may be control signals provided by a row driver (e.g., the row driver 140 of FIG. 2) operating in relation to a pixel array (e.g., pixel array 110 of FIG. 2) according to embodiments of the inventive concept.

FIGS. 6A, 6B, 6C, 6D and 6E are respective diagrams variously illustrating subpixel arrangements that share a floating diffusion region. Such subpixel arrangements may be included in subpixel arrays of pixels arrays included in embodiments of the inventive concept (e.g., the first subpixel array 110_1 of FIG. 3A, the second subpixel array 110_2 of FIG. 3B and the subpixel array(s) of FIGS. 4A to 4C).

Figure 6A:
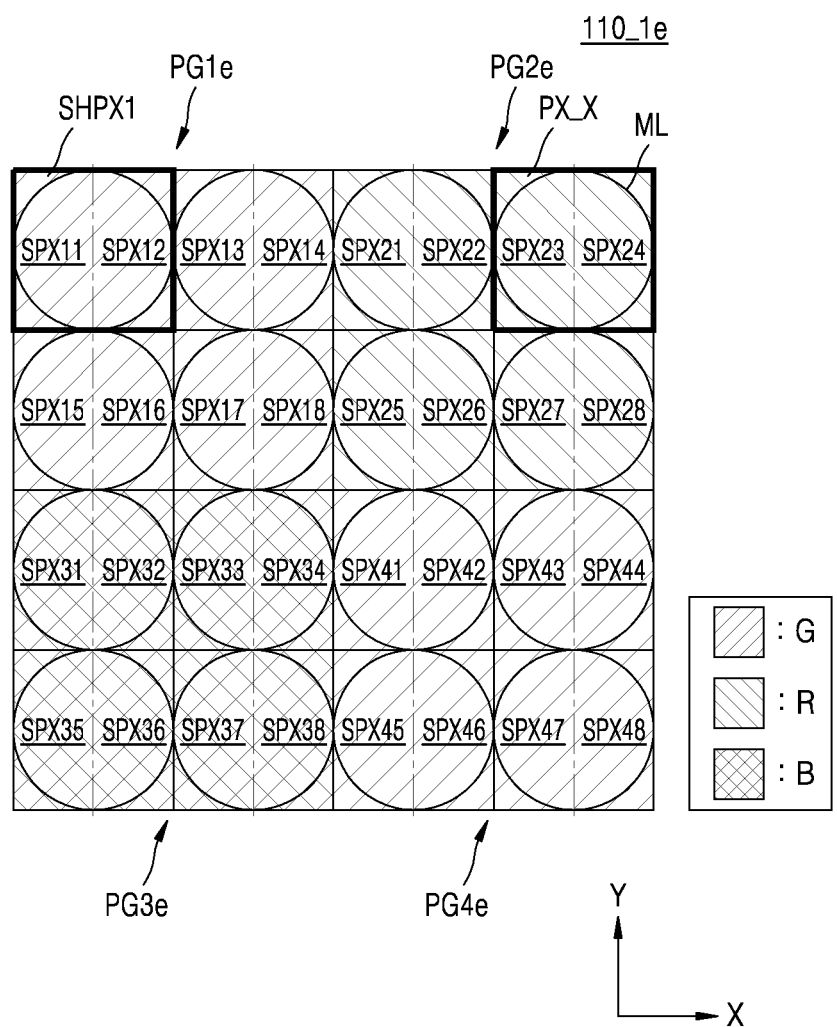
FIGS. 6A, 6B, 6C, 6D and 6E are respective diagrams further illustrating a plurality of subpixels sharing a floating diffusion region among the subpixels included in a first subpixel array of FIG. 3A.

Referring to FIG. 6A, a first subpixel array 100_1e may include first to fourth pixel groups PG1e to PG4e, and each of the first to fourth pixel groups PG1e to PG4e may include a plurality of horizontal pixels PX_X. Subpixels included in each of the horizontal pixels PX_X may be configured in a shared pixel structure SHPX1 which shares different floating diffusion regions. That is, the shared pixel structure SHPX1 may be a 2-shared structure including two subpixels. Hence, two subpixels will share a single floating diffusion region.

For example, a first subpixel SPX11 and a second subpixel SPX12 of the first pixel group PG1e may be configured in a shared pixel structure SHPX1 which shares a first floating diffusion region, while a third subpixel SPX13 and a fourth subpixel SPX14 of the first pixel group PG1e may be configured in a shared pixel structure SHPX1 which shares a different floating diffusion region. In this case, the first subpixel SPX11 and the third subpixel SPX13 are associated with different floating diffusion regions.

The foregoing description of the first pixel group PG1e may be applied to the second to fourth pixel groups PG2e to PG4e.

In the high resolution mode, the first subpixel array 100_1e may accumulate all of the photoelectric charge generated by the least two (2) photodiodes of different subpixels in a floating diffusion region. For example, the first subpixel array 100_1e may output a reset voltage as a pixel signal (e.g., VOUT of FIG. 5), and then, may output a pixel signal VOUT based on the first subpixel SPX11, and then may output a pixel signal VOUT based on the first subpixel SPX11 and the second subpixel SPX12. That is, subpixels (e.g., the first subpixel SPX11 and the second subpixel SPX12) configuring together in a single horizontal pixel may share a floating diffusion region (e.g., the floating diffusion region FD1 of FIG. 5), and thus, may output a pixel signal VOUT based on a photoelectric charge generated by a first photodiode (e.g., the first photodiode PD11 of FIG. 5) of the first subpixel SPX11 and a photoelectric charge generated by a second photodiode (e.g., the second photodiode PD12 of FIG. 5) of the second subpixel SPX12. Such a readout method may be a reset-signal-signal-reset-signal-signal-reset-signal-signal-reset-signal-signal (RSSRSSRSSRSS) readout method.

However, operation of an image sensor including the first subpixel array 100_1e in the high resolution mode according to an embodiment is not limited thereto. Although the first subpixel SPX11 and the second subpixel SPX12 share the floating diffusion region FD1, the first subpixel array 100_1e may output a pixel signal VOUT based on the first subpixel SPX11, subsequently reset the floating diffusion region FD1 to output a reset voltage as a pixel signal VOUT, and subsequently output a pixel signal VOUT based on the second subpixel SPX12. Such a readout method may be a reset-signal-reset-signal-reset-signal-reset-signal-reset-signal-reset-signal-reset-signal-reset-signal (RSRSRSRSRSRSRSRS) readout method.

Thus, image sensors consistent with embodiments of the inventive concept may variously adjust the number of floating diffusion region resets, in obtaining a pixel signal VOUT output from each of subpixels included in one shared pixel structure SHPX1 sharing one floating diffusion region. As the number of floating diffusion region resets increases, the time taken in obtaining a pixel signal VOUT output from each of subpixels included in one shared pixel structure SHPX1 also increases, but a floating diffusion region having a relatively low capacitance may be formed and a conversion gain may increase. On the other hand, as the number of floating diffusion region resets decreases, a floating diffusion region having a high capacitance may be needed. However, the time taken in obtaining a pixel signal VOUT output from each of subpixels included in one shared pixel structure SHPX1 may decrease.

In certain embodiments of the inventive concept, the first to fourth pixel groups PG1e to PG4e of the first subpixel array 100_1e may be respectively connected to different column output lines (e.g., respective corresponding column output lines of the first to $n-1^{th}$ column output lines CLO_0 to CLO_n−1). For example, a plurality of pixels PX_X of the first pixel group PG1e may be connected to the first column output line CLO_0, a plurality of pixels PX_X of the second pixel group PG2e may be connected to the second column output line CLO_1, a plurality of pixels PX_X of the third pixel group PG3e may be connected to the third column output line CLO_2, and a plurality of pixels PX_X of the fourth pixel group PG4e may be connected to the fourth column output line CLO_3.

In this case, an image sensor including the first subpixel array 100_1e may perform an analog pixel binning operation in the low resolution mode. That is, in the low resolution mode, the first subpixel array 100_1e may output a reset voltage as a pixel signal VOUT through the first column output line CLO_0, subsequently output a pixel signal VOUT based on the first, third, fifth, and seventh subpixels SPX11, SPX13, SPX15, and SPX17 through the first column output line CLO_0, and subsequently output a pixel signal VOUT based on the first to eighth subpixels SPX11 to SPX18 through the first column output line CLO_0. Such a readout method may be a reset-signal-signal (RSS) readout method.

Alternatively, in the low resolution mode, the first subpixel array 100_1e may output the reset voltage as a pixel signal VOUT through the first column output line CLO_0, subsequently output the pixel signal VOUT based on the first, third, fifth, and seventh subpixels SPX11, SPX13, SPX15, and SPX17 through the first column output line CLO_0, subsequently output the reset voltage as a pixel signal VOUT through the first column output line CLO_0 again, and subsequently output a pixel signal VOUT based on the second, fourth, sixth, and eighth subpixels SPX12, SPX14, SPX16, and SPX18 through the first column output line CLO_0. Such a readout method may be a reset-signal-reset-signal (RS-RS) readout method.

However, image sensors according to embodiments of the inventive concept are not limited thereto, and the plurality of horizontal pixels PX_X included in the first subpixel array 100_1e may be respectively connected to different column output lines. In this case, an image sensor including the first subpixel array 100_1e may perform a digital pixel binning operation in the low resolution mode. For example, in the low resolution mode, the first subpixel array 100_1e may output different pixel signals VOUT based on the first, third, fifth, and seventh subpixels SPX11, SPX13, SPX15, and SPX17 through different column output lines, and each of the pixel signals VOUT may be converted into a digital signal by a CDS (for example, 151 of FIG. 2) and an ADC (for example, 153 of FIG. 2) and may be stored in a buffer (for example, 155 of FIG. 2). The buffer 155 may output data, corresponding to a pixel signal output from each of the first, third, fifth, and seventh subpixels SPX11, SPX13, SPX15, and SPX17, as one signal to a signal processor (for example, 130 of FIG. 2) or the outside of the image sensor. Subsequently, the buffer 155 may output data, corresponding to a pixel signal output from each of the second, fourth, sixth, and eighth subpixels SPX12, SPX14, SPX16, and SPX18, as one signal to the signal processor 130 or the outside of the image sensor.

From the foregoing, those skilled in the art will recognize that an image sensor according to embodiments of the inventive concept may include a subpixel array (e.g., the first subpixel array 100_1e of FIG. 6A) and may perform an AF function according to pixel units in the high resolution mode, or perform the AF function according to pixel group units in the low resolution mode.

In other embodiments of the inventive concept additionally capable of operating in medium resolution mode, image sensor including the first subpixel array 100_1e may perform the analog pixel binning operation or the digital pixel binning operation. Therefore, the image sensor including the first subpixel array 100_1e may perform an AF function according to pixel units in the high resolution mode, perform the AF function according to pixel group units in the low resolution mode. In this manner, image sensors according to embodiments of the inventive concept may effectively operate in the high resolution mode, the low resolution mode, and the medium resolution mode to properly meet the needs of the illumination environment.

Figure 6B:
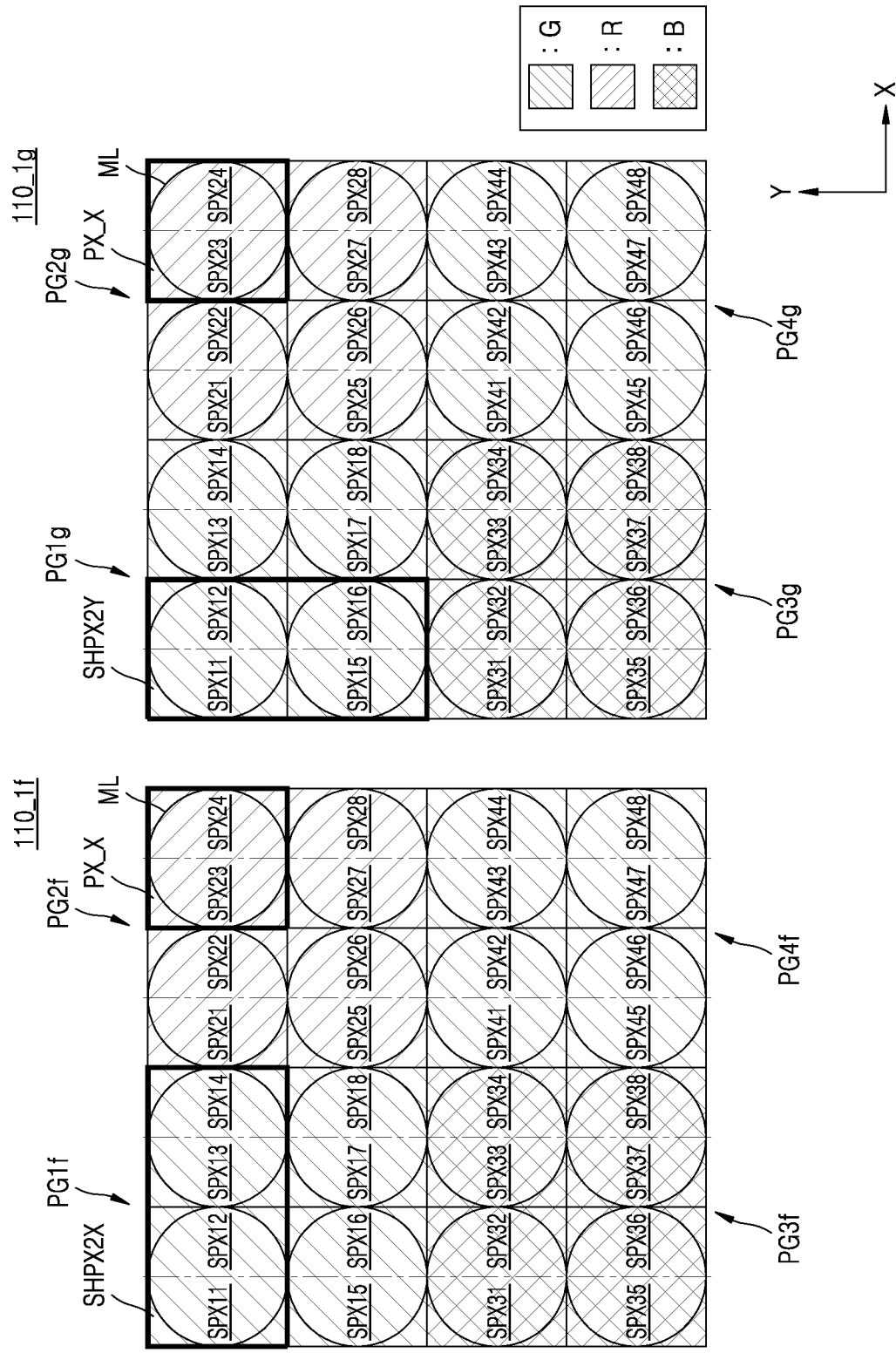

Referring to FIG. 6B, a first subpixel array 100_1f includes first to fourth pixel groups PG1f to PG4f, wherein each of the first to fourth pixel groups PG1f to PG4f includes a plurality of horizontal pixels PX_X. Adjacently disposed (in the X direction) horizontal pixels PX_X among the plurality of horizontal pixels PX_X may configured in a shared pixel structure SHPX2X in order to share a single floating diffusion region. That is, the shared pixel structure SHPX2X of FIG. 6B is a 4-shared structure including four subpixels that share a single floating diffusion region.

An image sensor including the first subpixel array 100_1f may perform an AF function according to pixel units in the high resolution mode, and may perform the AF function according to pixel groups units in conjunction with the first to fourth pixel groups PG1f to PG4f in the low resolution mode. For example, in the high resolution mode, the first subpixel array 100_1f may output a pixel signal VOUT according to the above-described RSSRSSRSSRSS readout method. Alternatively, the first subpixel array 100_1f may output the pixel signal VOUT according to the above-described RSRSRSRSRSRSRSRS readout method.

Alternatively, in the high resolution mode, the first subpixel array 100_1f may accumulate all photoelectric charge, generated by four different photodiodes, into one floating diffusion region. For example, the first subpixel array 100_1f may output a reset voltage as a pixel signal VOUT, and then, may output a pixel signal VOUT based on a first subpixel SPX11, output a pixel signal VOUT based on the first subpixel SPX11 and a second subpixel SPX12, output a pixel signal VOUT based on the first to third subpixels SPX11 to SPX13, and output a pixel signal VOUT based on the first to fourth subpixels SPX11 to SPX14. Such a readout method may be a reset-signal-signal-signal-signal-reset-signal-signal-signal (RSSSSRSSSS) readout method.

Alternatively, for example, in the high resolution mode, the first subpixel array 100_1f may output the reset voltage as the pixel signal VOUT, and then, may output the pixel signal VOUT based on the first subpixel SPX11, output the pixel signal VOUT based on the first subpixel SPX11 and the second subpixel SPX12, and output the pixel signal VOUT based on the first to fourth subpixels SPX11 to SPX14. That is, in the high resolution mode, the first subpixel array 100_1f may simultaneously accumulate photoelectric charge, generated by photodiodes of the third and fourth subpixels SPX13 and SPX14, into one floating diffusion region. Such a readout method may be a reset-signal-signal-signal-reset-signal-signal-signal (RSSSRSSS) readout method. In this case, the third and fourth subpixels SPX13 and SPX14 may not be used for the AF function, but a total readout speed of the first subpixel array 100_1f may increase.

On the other hand, an image sensor including the first subpixel array 100_1f may perform an analog pixel binning operation in the low resolution mode. For example, the first subpixel array 100_1f may output a pixel signal VOUT based on first, third, fifth, and seventh subpixels SPX11, SPX13, SPX15, and SPX17 to a first column output line CLO_0, and then, may output a pixel signal VOUT based on first to eighth subpixels SPX11 to SPX18 to the first column output line CLO_0. Alternatively, for example, the first subpixel array 100_1f may output the pixel signal VOUT based on the first, third, fifth, and seventh subpixels SPX11, SPX13, SPX15, and SPX17 to the first column output line CLO_0, subsequently output a reset voltage as a pixel signal VOUT to the first column output line CLO_0 again, and subsequently output a pixel signal VOUT based on the second, fourth, sixth, and eighth subpixels SPX12, SPX14, SPX16, and SPX18 to the first column output line CLO_0.

On the other hand, the first subpixel array 100_1f may perform a digital pixel binning operation in the low resolution mode. For example, the first subpixel array 100_1f may output a pixel signal VOUT based on the first and third subpixels SPX11 and SPX13 and a pixel signal VOUT based on the fifth and seventh subpixels SPX15 and SPX17 to different column output lines, and each of the pixel signals VOUT may be converted into a digital signal by a CDS (for example, 151 of FIG. 2) and an ADC (for example, 153 of FIG. 2) and may be stored in a buffer (for example, 155 of FIG. 2). The buffer 155 may output data, corresponding to a pixel signal output from each of the first, third, fifth, and seventh subpixels SPX11, SPX13, SPX15, and SPX17, as one signal to a signal processor (for example, 130 of FIG. 2) or the outside of the image sensor. Subsequently, the buffer 155 may output data, corresponding to a pixel signal output from each of the second, fourth, sixth, and eighth subpixels SPX12, SPX14, SPX16, and SPX18, as one signal to the signal processor 130 or the outside of the image sensor. Therefore, an image sensor including the first subpixel array 100_1f may perform an AF function according to pixel units in the high resolution mode, and may perform the AF function in pixel group units in the low resolution mode. A first subpixel array 100_1g may include first to fourth pixel groups PG1g to PG4g, and each of the first to fourth pixel groups PG1g to PG4g may include a plurality of horizontal pixels PX_X. Adjacently disposed (in the Y direction) horizontal pixels PX_X among the plurality of horizontal pixels PX_X may configured in a shared pixel structure SHPX2Y which shares a single floating diffusion region. That is, the shared pixel structure SHPX2Y may be a 4-shared structure including four subpixels, and four subpixels each time may configured in the shared pixel structure SHPX2Y, which shares a floating diffusion region. In each of the high resolution mode and the low resolution mode, the description of the operation of the first subpixel array 100_1f described above may be similarly applied to an operation of the first subpixel array 100_1g.

Figure 6C:
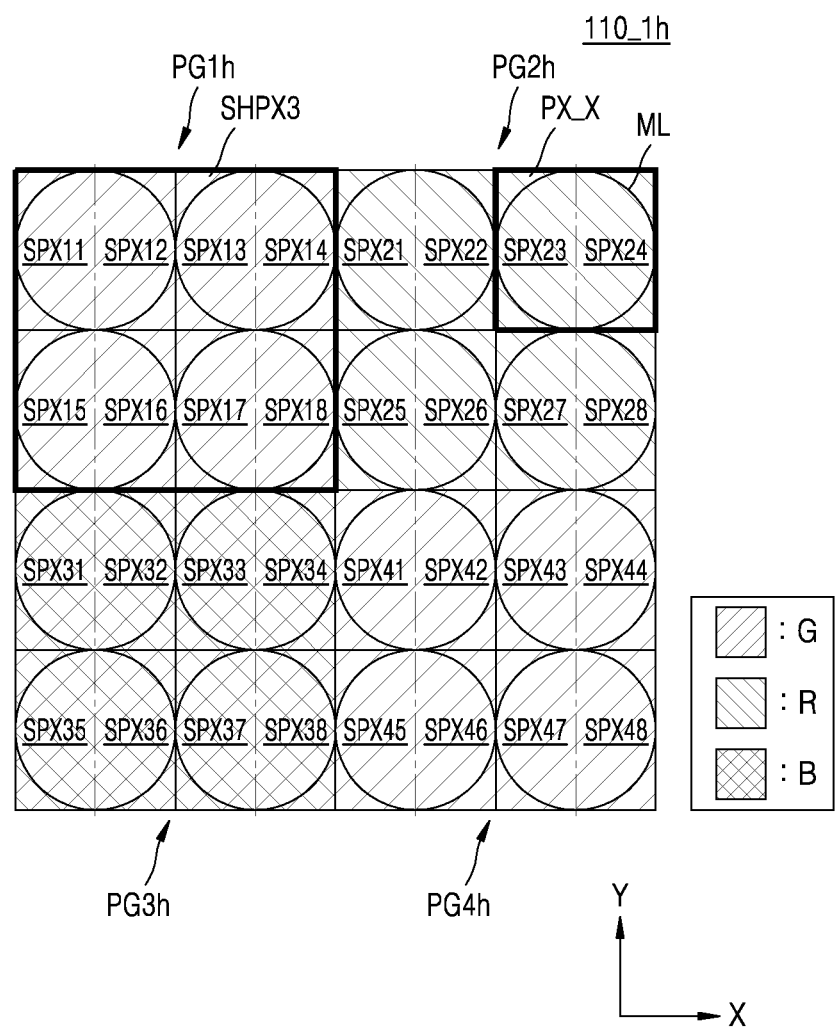

Referring to FIG. 6C, a first subpixel array 100_1h includes first to fourth pixel groups PG1h to PG4h, wherein each of the first to fourth pixel groups PG1h to PG4h includes a plurality of horizontal pixels PX_X, wherein the horizontal pixels PX_X included in a particular same group are configured in a shared pixel structure SHPX3 which shares a floating diffusion region. That is, the shared pixel structure SHPX3 may be an 8-shared structure including eight subpixels, and eight subpixels each time may configure the shared pixel structure SHPX3, which shares a floating diffusion region. Therefore, subpixels included in different pixel groups may not share a floating diffusion region. An operation of the first subpixel array 100_1h in a high resolution mode and an operation of the first subpixel array 100_1h in a low resolution mode will be described below with reference FIG. 9 to FIG. 11.

Figure 6D:
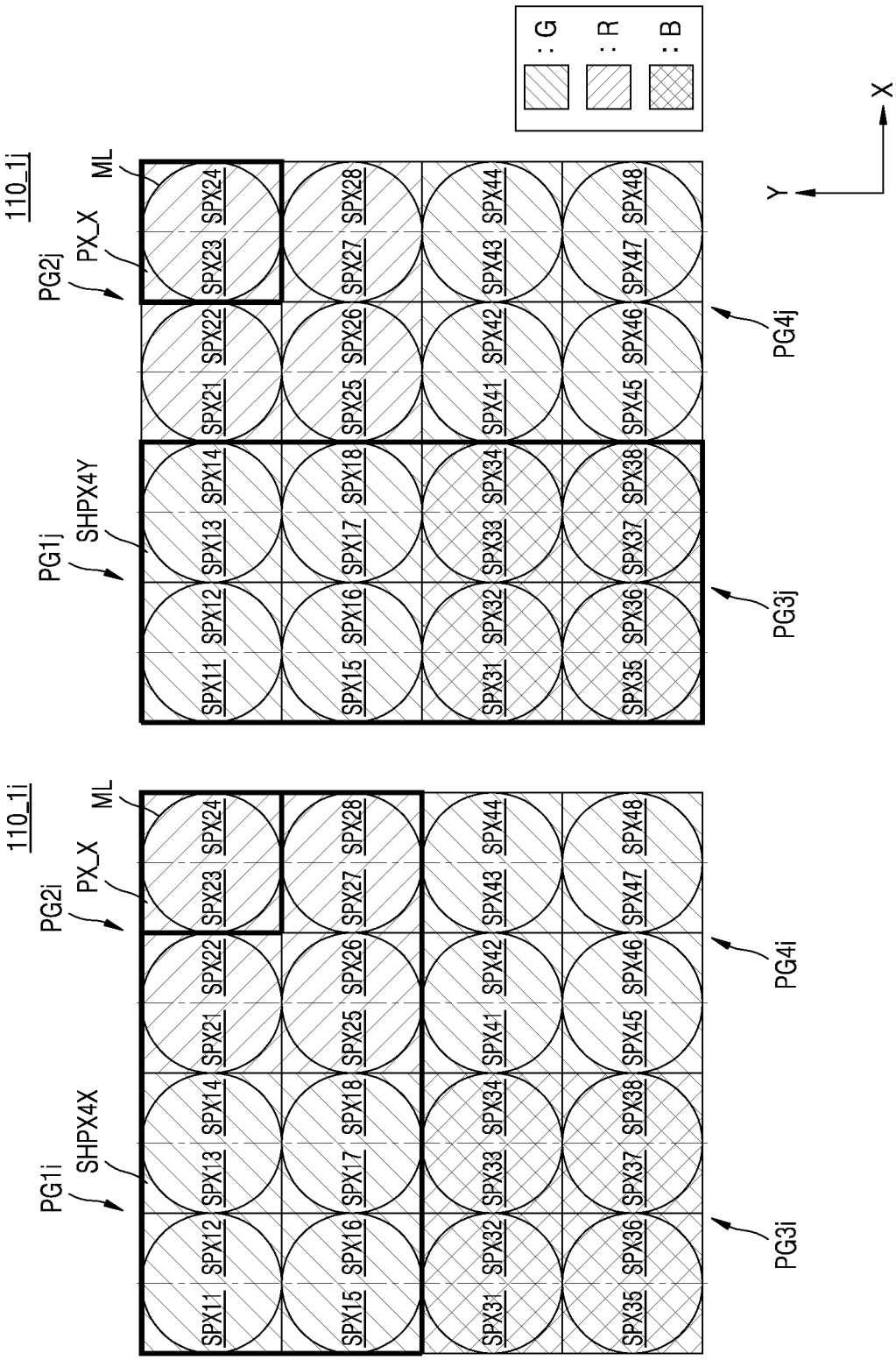

Referring to FIG. 6D, a first subpixel array 100_1i include first to fourth pixel groups PG1i to PG4i, wherein each of the first to fourth pixel groups PG1i to PG4i includes a plurality of horizontal pixels PX_X. Adjacently disposed (in the X direction) horizontal pixels PX_X may be configured in a shared pixel structure SHPX4X which shares a single floating diffusion region. That is, the shared pixel structure SHPX4X may be a 16-shared structure including sixteen subpixels, and sixteen subpixels each time may configure the shared pixel structure SHPX4X, which shares a floating diffusion region.

For example, first to eighth subpixels SPX11 to SPX18 of the first pixel group PG1i and first to eighth subpixels SPX21 to SPX28 of the second pixel group PG2i may configure one shared pixel structure SHPX4X, which shares a floating diffusion region, and first to eighth subpixels SPX31 to SPX38 of the third pixel group PG3i and first to eighth subpixels SPX41 to SPX48 of the fourth pixel group PG4i may configure one shared pixel structure SHPX4X, which shares a floating diffusion region. Therefore, subpixels included in different pixel groups may share a floating diffusion region.

A first subpixel array 100_1j includes first to fourth pixel groups PG1j to PG4j, wherein each of the first to fourth pixel groups PG1j to PG4j includes a plurality of horizontal pixels PX_X. Adjacently disposed (in the Y direction) horizontal pixels PX_X may be configured in a shared pixel structure SHPX4Y which shares a single floating diffusion region. That is, the shared pixel structure SHPX4Y may be a 16-shared structure including sixteen subpixels, and sixteen subpixels each time may configure the shared pixel structure SHPX4Y, which shares a floating diffusion region.

For example, first to eighth subpixels SPX11 to SPX18 of the first pixel group PG1j and first to eighth subpixels SPX31 to SPX38 of the third pixel group PG3j may configure one shared pixel structure SHPX4Y, which shares a floating diffusion region, and first to eighth subpixels SPX21 to SPX28 of the second pixel group PG2j and first to eighth subpixels SPX41 to SPX48 of the fourth pixel group PG4j may configure one shared pixel structure SHPX4Y, which shares a floating diffusion region. Therefore, subpixels included in different pixel groups may share a floating diffusion region.

The description of the first subpixel array 100_1h of FIG. 6C in the high resolution mode may be similarly applied to an operation of each of the first subpixel arrays 100_1i and 100_1j in the high resolution mode, and the description of the first subpixel array 100_1h of FIG. 6C in the low resolution mode may be similarly applied to an operation of each of the first subpixel arrays 100_1i and 100_1j in the low resolution mode.

Figure 6E:
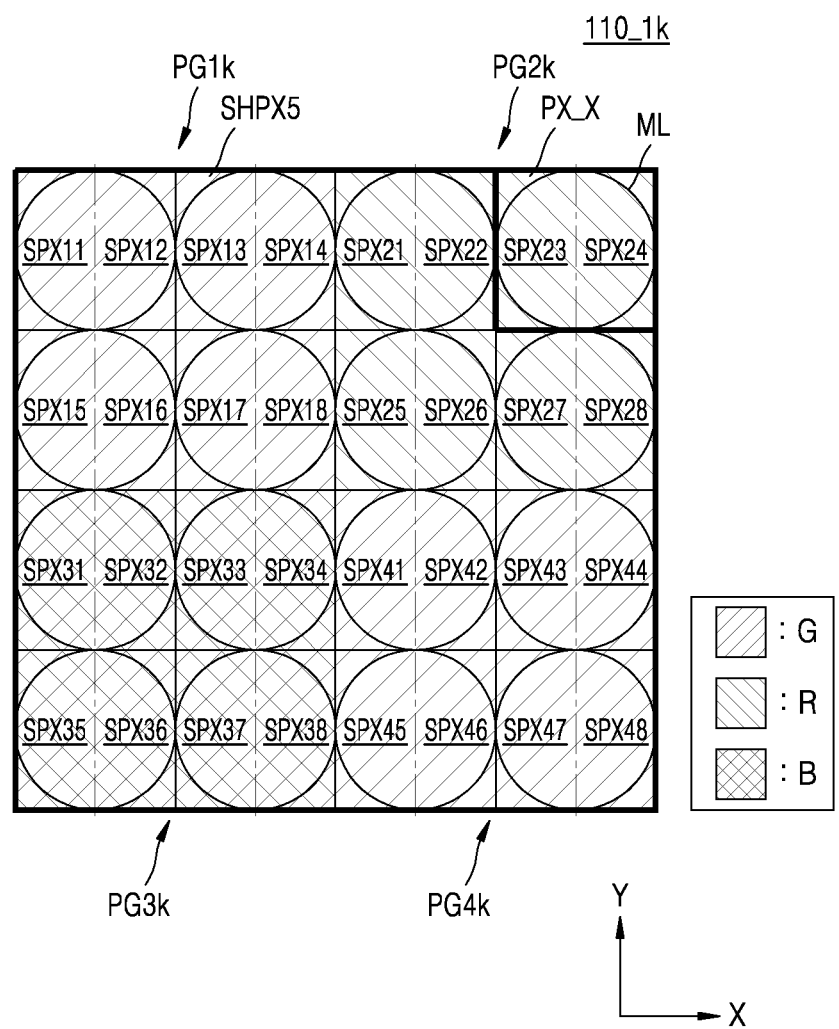

Referring to FIG. 6E, a first subpixel array 100_1k includes first to fourth pixel groups PG1k to PG4k, wherein each of the first to fourth pixel groups PG1k to PG4k includes a plurality of horizontal pixels PX_X. The horizontal pixels PX_X included in the first to fourth pixel groups PG1k to PG4k may configured in a shared pixel structure SHPX5 which shares a single floating diffusion region. That is, the shared pixel structure SHPX5 may be a 32-shared structure including thirty-two subpixels, and thirty-two subpixels each time may configure the shared pixel structure SHPX5, which shares a floating diffusion region. The description of the first subpixel array 100_1h of FIG. 6C in the high resolution mode may be similarly applied to an operation of the first subpixel array 100_1k in the high resolution mode, and the description of the first subpixel array 100_1h of FIG. 6C in the low resolution mode may be similarly applied to an operation of the first subpixel array 100_1k in the low resolution mode.

In the illustrated embodiments of FIGS. 6A, 6B, 6C, 6D and 6E, the shared pixel structures SHPX1, SHPX2, SHPX3, SHPX4 and SHPX5 respectively provided in the first subpixel arrays 110_1e, 110_1f, 110_1g, 110_1h, 110_1i, 110_1j and 110_1k have been described above in some particular detail. However, image sensors according to embodiments of the inventive concept are not limited thereto, and the structure of various subpixel arrays may be variously implemented.

Figure 7:
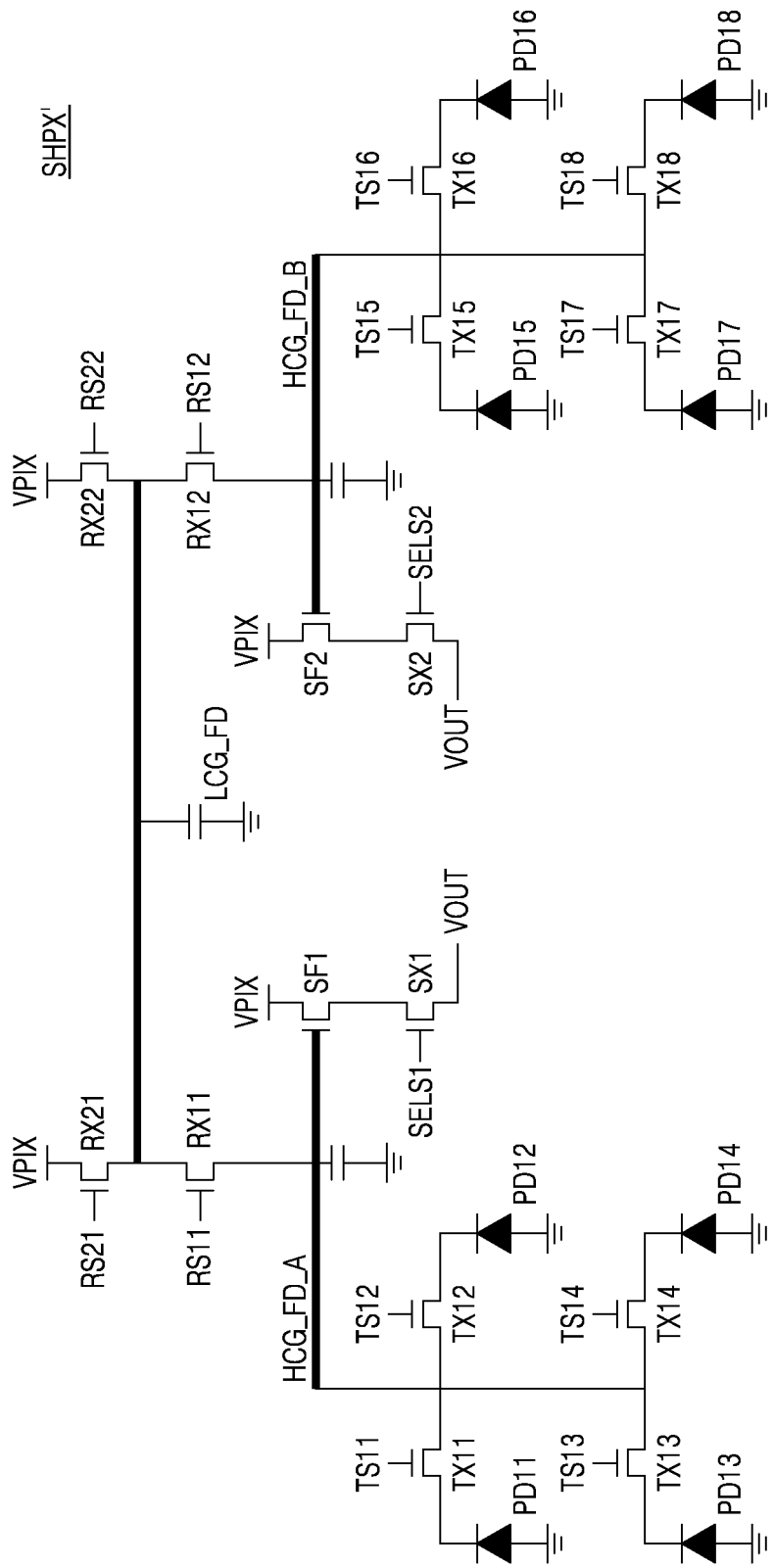
FIG. 7 is a circuit diagram illustrating in one embodiment an arrangement of subpixels sharing a floating diffusion region.

FIG. 7 is a circuit diagram further illustrating in one embodiment an arrangement of subpixels sharing a floating diffusion region. In FIG. 7, a shared pixel structure provides a dual conversion gain (DCG) function. The shared pixel structure of FIG. 7 assumes four photodiodes sharing a first floating diffusion region HCG_FD_A, and four photodiodes sharing a second floating diffusion region HCG_FD_B.

Referring to FIG. 7, a shared pixel structure SHPX' includes first to eighth photodiodes PD11 to PD18, first to eighth transmission transistors TX11 to TX18, first and second selection transistors SX1 and SX2, first and second drive transistors SF1 and SF2, and first to fourth reset transistors RX11, RX21, RX12, and RX22.

The first to fourth transmission transistors TX11 to TX14 may respectively connect the first to fourth photodiodes PD11 to PD14 to the first floating diffusion region HCG_FD_A in response to first to fourth transmission control signals TS11 to TS14 corresponding thereto. The fifth to eighth transmission transistors TX15 to TX18 may respectively connect the fifth to eighth photodiodes PD15 to PD18 to the second floating diffusion region HCG_FD_B in response to fifth to eighth transmission control signals TS15 to TS18 corresponding thereto. For example, subpixels including the first to fourth photodiodes PD11 to PD14 may share the first floating diffusion region HCG_FD_A, and subpixels including the fifth to eighth photodiodes PD15 to PD18 may share the second floating diffusion region HCG_FD_B.

The first reset transistor RX11 and the second reset transistor RX21 may periodically reset photoelectric charge accumulated into the first floating diffusion region HCG_FD_A in response to the first reset control signal RS11 and the second reset control signal RS21. A source electrode of the first reset transistor RX11 may be connected to the first floating diffusion region HCG_FD_A, and a drain electrode thereof may be connected to the second reset transistor RX21 and a third floating diffusion region LCG_FD. A source electrode of the second reset transistor RX21 may be connected to the first reset transistor RX11 and the third floating diffusion region LCG_FD, and a drain electrode thereof may be connected to a source voltage VPIX.

The third reset transistor RX12 and the fourth reset transistor RX22 may periodically reset photoelectric charge accumulated into the second floating diffusion region HCG_FD_B in response to the third reset control signal RS12 and the fourth reset control signal RS22. A source electrode of the third reset transistor RX12 may be connected to the second floating diffusion region HCG_FD_B, and a drain electrode thereof may be connected to the fourth reset transistor RX22 and the third floating diffusion region LCG_FD. A source electrode of the fourth reset transistor RX22 may be connected to the third reset transistor RX12 and the third floating diffusion region LCG_FD, and a drain electrode thereof may be connected to the source voltage VPIX.

When the first reset transistor RX11 is turned ON, the first floating diffusion region HCG_FD_A may be connected to the third floating diffusion region LCG_FD. Moreover, when the third reset transistor RX12 is turned ON, the second floating diffusion region HCG_FD_B may be connected to the third floating diffusion region LCG_FD. Therefore, when all of the first and third reset transistors RX11 and RX12 are turned ON, the first floating diffusion region HCG_FD_A, the second floating diffusion region HCG_FD_B, and the third floating diffusion region LCG_FD may be connected to one another. Therefore, the shared pixel structure of the image sensor according to an embodiment may be changed from the shared pixel structures SHPX2X and SHPX2Y of the 4-shared structure of FIG. 6B to the shared pixel structure SHPX3 of the 8-shared structure of FIG. 6C.

The first selection transistor SX1 and the second selection transistor SX2 may output a pixel signal VOUT to a CDS (for example, 151 of FIG. 2) through a column output line in response to a first selection signal SELS1 and a second selection signal SELS2.

In an image sensor according to embodiments of the inventive concept, as the capacitance of a floating diffusion region decreases/increases, a conversion gain will increase/decrease accordingly. Thus, as the capacitance of a floating diffusion region increases, relatively more photoelectric charge is accumulated in the floating diffusion region. Thus result decreases the number of reset operations that must be performed and therefore increases overall operating speed. Therefore, depending on the case, a pixel array may operate in the 4-shared structure in a high conversion gain (HCG) mode and may operate in the 8-shared structure in a low conversion gain (LCG) mode, thereby supporting a dual conversion gain (DCG) functions.

FIGS. 8, 9, 10 and 11 are respective timing diagrams further illustrating an operation of an image sensor according to embodiments of the inventive concept. In the timing diagrams, for convenience of description, the image sensor described with reference to the first subpixel array 100_1h including the shared pixel structure SHPX3 illustrated in FIG. 6C is assumed.

In one embodiment, operation of an image sensor is described with reference to FIGS. 8 and 9. A plurality of horizontal pixels PX_X included in the first subpixel array 100_1h providing a pixel signal for an AF function in the high resolution mode is further assumed. In another embodiment, operation of an image sensor is described with reference to FIG. 10. Here again, a plurality of horizontal pixels PX_X included in the first subpixel array 100_1h providing a pixel signal for an AF function in the high resolution mode is assumed. In still another embodiment, operation of an image sensor described below with reference to FIG. 11 may be an embodiment where a pixel group outputs a pixel signal for an AF function in the low resolution mode.

Figure 8:
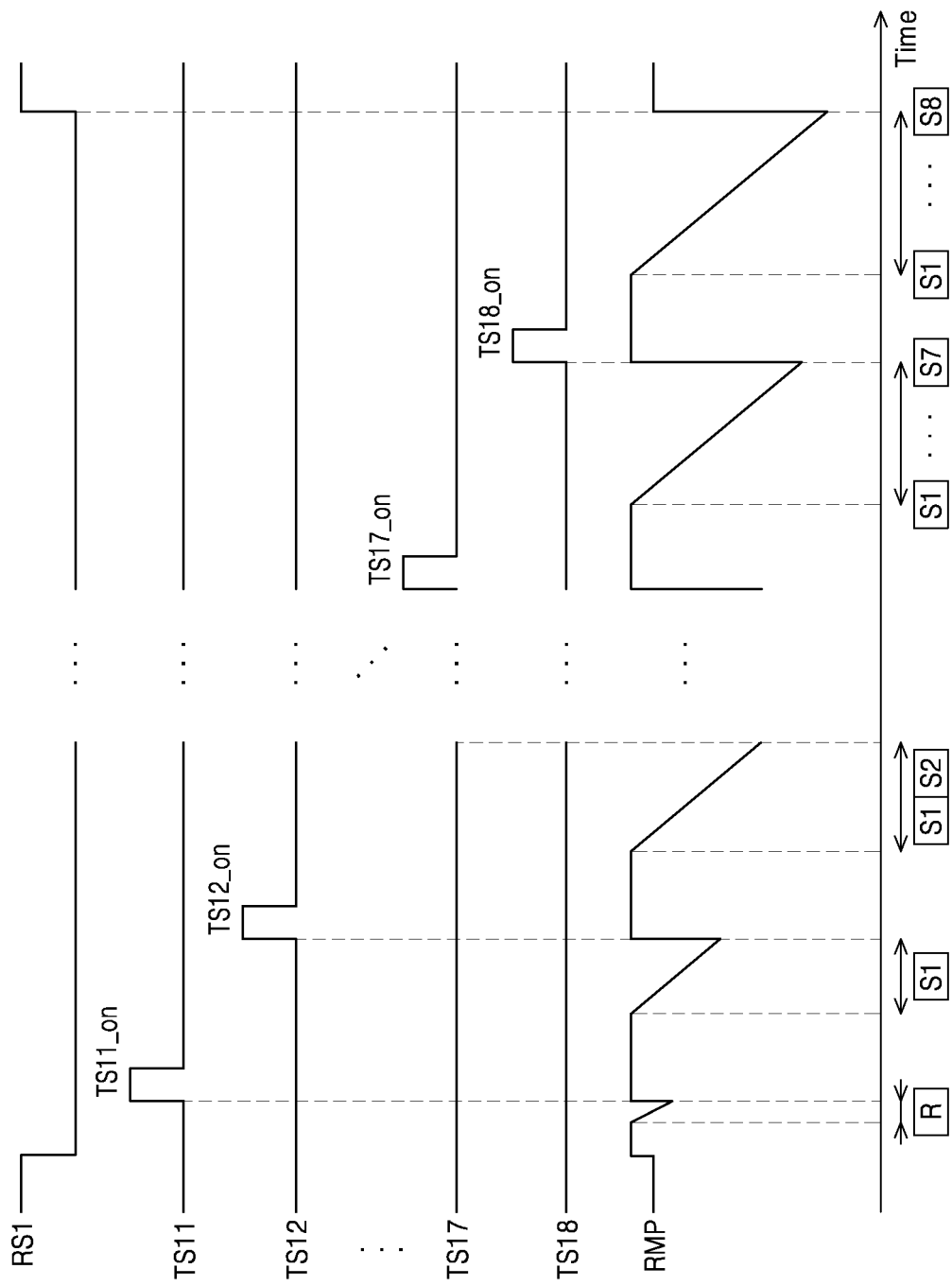
FIGS. 8, 9, 10 and 11 are respective timing diagrams further illustrating in several embodiments certain timing relationships between various control signals in the operation of the image sensor 100 of FIG. 2.

Referring collectively to FIGS. 5, 6C, and 8, in the first subpixel SPX11, photoelectric charge generated by the first photodiode PD11 is accumulated in the floating diffusion region FD1 in response to a switching operation of the first transmission transistor TX11 controlled by the first transmission control signal TS11. In the second subpixel SPX12, photoelectric charge generated by the second photodiode PD12 is accumulated in the floating diffusion region FD1 in response to a switching operation of the second transmission transistor TX12 controlled by the second transmission control signal TS12. In the seventh subpixel SPX17, photoelectric charge generated by a seventh photodiode is accumulated in the floating diffusion region FD1 in response to a switching operation of a seventh transmission transistor controlled by the seventh transmission control signal TS17, and in the eighth subpixel SPX18, photoelectric charge generated by an eighth photodiode is accumulated in the floating diffusion region FD1 in response to a switching operation of an eighth transmission transistor controlled by the eighth transmission control signal TS18.

The first pixel group PG1h may be reset, and then, first to eighth transmission transistors of the first to eighth subpixels SPX11 to SPX18 may be sequentially turned ON. That is, the reset control signal RS1 may be shifted from a logic high level to a logic low level, and then, the first to eighth transmission control signals TS11 to TS18 may be sequentially shifted from a logic low level to a logic high level.

A ramp voltage RMP generated by a ramp signal generator (e.g., ramp signal generator 157 of FIG. 2) may include nine pulses during a period where the reset control signal RS1 is shifted from a logic high level to a logic low level and then is shifted to a logic high level again. Each of the pulses may have a triangular-wave shape which sequentially decreases and then increases at a time again. As shown in FIG. 8, the pulse may progressive increase in amplitude swing with each activation, but this signaling approach is merely one example.

Thus, a first pulse R may be a pulse corresponding to a pixel voltage VOUT when the floating diffusion region FD1 of the first pixel group PG1h is reset. A reset voltage may be relatively low in level of a varying signal.

A second pulse S1 may be a pulse corresponding to a pixel signal VOUT based on a photoelectric charge generated by the first photodiode PD11 of the first subpixel SPX11. In the pixel signal VOUT, voltage drop may be added to the reset voltage, and thus, the second pulse S1 may be adjusted to dip lower than the first pulse R and then be restored.

A third pulse S1S2 may be a pulse corresponding to a pixel signal VOUT based on photoelectric charge generated by the first photodiode PD11 of the first subpixel SPX11 and the second photodiode PD12 of the second subpixel SPX12. A fourth pulse S1 . . . S7 may be a pulse corresponding to a pixel signal VOUT based on photoelectric charge generated by first to seventh photodiodes of the first to seventh subpixels SPX11 to SPX17, and a fifth pulse S1 . . . S8 may be a pulse corresponding to a pixel signal VOUT based on photoelectric charge generated by first to eighth photodiodes of the first to eighth subpixels SPX11 to SPX18.

As described above, a waveform of the ramp voltage RMP may be derived from the pixel signal VOUT output from the first pixel group PG1h. That is, the first pixel group PG1h may first output a reset voltage as a pixel signal VOUT, and then, may output a pixel signal VOUT based on the first subpixel SPX11, output a pixel signal VOUT based on the first subpixel SPX11 and the second subpixel SPX12, output a pixel signal VOUT based on the first to third subpixels SPX11 to SPX13, output a pixel signal VOUT based on the first to fourth subpixels SPX11 to SPX14, output a pixel signal VOUT based on the first to fifth subpixels SPX11 to SPX15, output a pixel signal VOUT based on the first to sixth subpixels SPX11 to SPX16, output a pixel signal VOUT based on the first to seventh subpixels SPX11 to SPX17, and output a pixel signal VOUT based on the first to eighth subpixels SPX11 to SPX18. Such a readout method may be a reset-signal-signal-signal-signal-signal-signal-signal-signal (RSSSSSSSS) readout method.

The photoelectric charge generated by the first to eighth subpixels SPX11 to SPX18 included in the first pixel group PG1h may be sequentially accumulated in the floating diffusion region FD1, and pixel signals VOUT based thereon may be sequentially output. The pixel signals VOUT corresponding to the photoelectric charge generated by the first to eighth subpixels SPX11 to SPX18 may be sequentially output after a reset operation is performed on the first pixel group PG1h once, and thus, the image sensor according to the present disclosure may perform a high-speed operation. Therefore, when a high-speed operation is needed like a moving image mode, the number of reset operations may decrease, and the photoelectric charge generated by the first to eighth subpixels SPX11 to SPX18 may be sequentially accumulated in the floating diffusion region FD1.

Moreover, the first to eighth transmission transistors of the first to eighth subpixels SPX11 to SPX18 may be sequentially turned ON (i.e. the TS11_on to TS18_on as shown in FIG. 8), and the pixel signals VOUT corresponding to the photoelectric charge generated by the first to eighth subpixels SPX11 to SPX18 may be sequentially output, thereby providing the high resolution mode which allows the AF function to be performed in units of pixels. At this time, each of the plurality of pixels PX_X included in the first pixel group PG1h may output a pixel signal VOUT including AF information.

Figure 9:
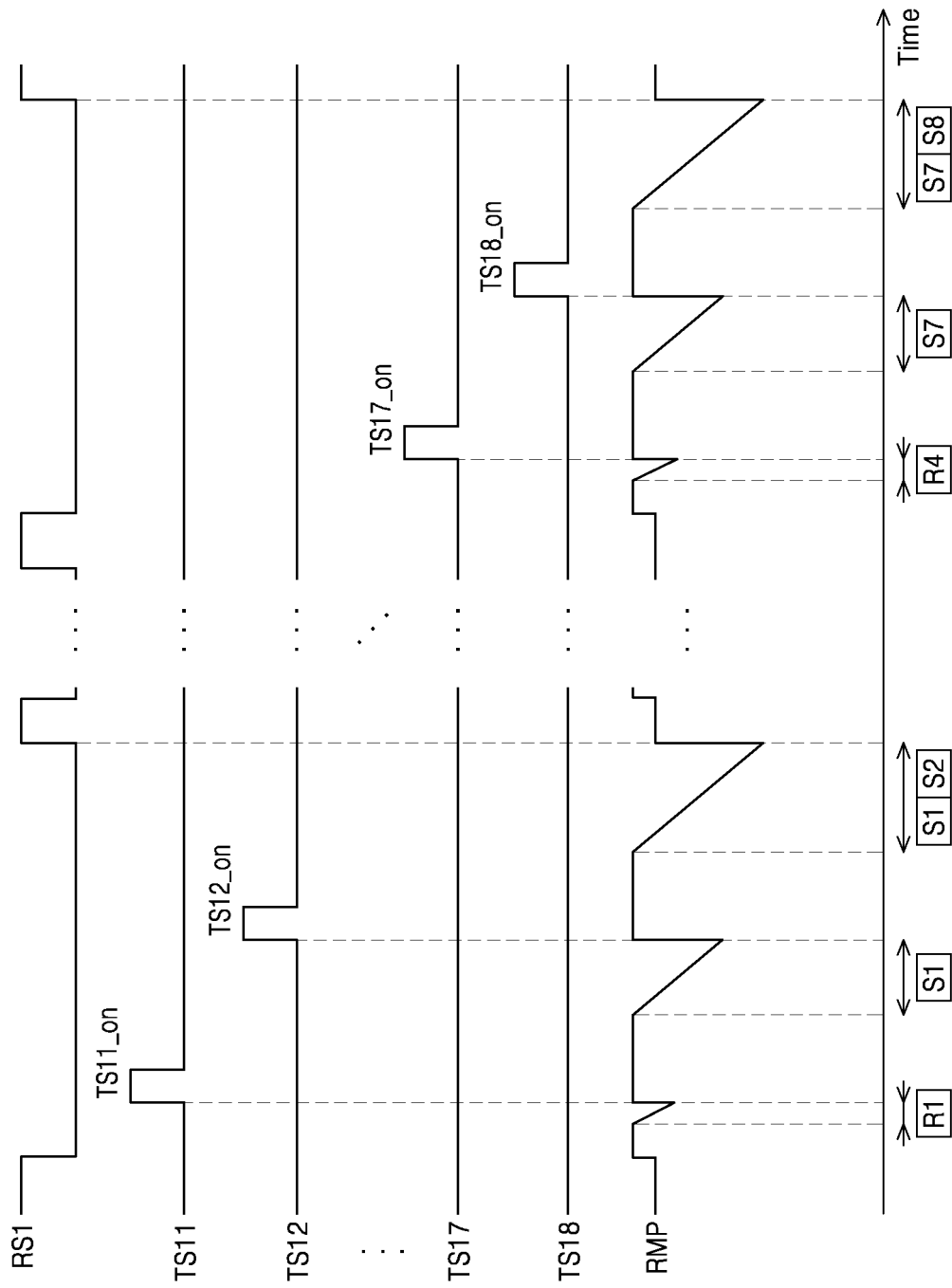

Referring collectively to FIGS. 5, 6C, and 9, first to eighth transmission transistors of the first to eighth subpixels SPX11 to SPX18 may be sequentially turned ON. That is, the first to eighth transmission control signals TS11 to TS18 may be sequentially shifted from a logic low level to a logic high level.

A first pulse R1 of a ramp voltage RMP may be a pulse corresponding to a pixel voltage VOUT of when the floating diffusion region FD1 of the first pixel group PG1h is reset. A second pulse S1 may be a pulse corresponding to a pixel signal VOUT based on a photoelectric charge generated by the first photodiode PD11 of the first subpixel SPX11. A third pulse S1S2 may be a pulse corresponding to a pixel signal VOUT based on photoelectric charge generated by the first photodiode PD11 of the first subpixel SPX11 and the second photodiode PD12 of the second subpixel SPX12.

A fourth pulse R4 may be a pulse corresponding to a pixel voltage VOUT of when the floating diffusion region FD1 of the first pixel group PG1h is reset. A fifth pulse S7 may be a pulse corresponding to a pixel signal VOUT based on a photoelectric charge generated by the seventh photodiode of the seventh subpixel SPX17. A sixth pulse S7S8 may be a pulse corresponding to a pixel signal VOUT based on photoelectric charge generated by the seventh photodiode of the seventh subpixel SPX17 and the eighth photodiode of the eighth subpixel SPX18.

The first pixel group PG1h may first output a reset voltage as a pixel signal VOUT, and then, may output a pixel signal VOUT based on the first subpixel SPX11 and may output a pixel signal VOUT based on the first subpixel SPX11 and the second subpixel SPX12, Subsequently, the first pixel group PG1h may first output the reset voltage as a pixel signal VOUT, and then, may output a pixel signal VOUT based on the third subpixel SPX13 and may output a pixel signal VOUT based on the third subpixel SPX13 and the fourth subpixel SPX14. Subsequently, the first pixel group PG1h may output the reset voltage as a pixel signal VOUT, and then, may output a pixel signal VOUT based on the fifth subpixel SPX15 and may output a pixel signal VOUT based on the fifth subpixel SPX15 and the sixth subpixel SPX16. Subsequently, the first pixel group PG1h may output the reset voltage as a pixel signal VOUT, and then, may output a pixel signal VOUT based on the seventh subpixel SPX17 and may output a pixel signal VOUT based on the seventh subpixel SPX17 and the eighth subpixel SPX18. Such a readout method may be the RSSRSSRSSRSS readout method described above with reference to FIG. 6B.

The photoelectric charge generated by some (e.g., selected ones) of the first to eighth subpixels SPX11 to SPX18 included in the first pixel group PG1h is accumulated in the floating diffusion region FD1, and after the floating diffusion region FD1 is reset, photoelectric charge generated by some other subpixels is accumulated in the floating diffusion region FD1 again. Accordingly, even when a capacitance of the floating diffusion region FD1 is low, the image sensor according to the present disclosure may provide the AF function. Moreover, the first to eighth transmission transistors of the first to eighth subpixels SPX11 to SPX18 may be sequentially turned ON, and the pixel signals VOUT corresponding to the photoelectric charge generated by the first to eighth subpixels SPX11 to SPX18 may be sequentially output, thereby providing the high resolution mode which allows the AF function to be performed in units of pixels. At this time, each of the plurality of pixels PX_X included in the first pixel group PG1h may output a pixel signal VOUT including AF information.

Image sensors according to embodiments of the inventive concept are not limited to the above-described readout method(s). The process of outputting a pixel signal VOUT based on each of the first to eighth subpixels SPX11 to SPX18 may use a readout method (i.e., an RSSSSRSSSS readout method) where a pixel signal VOUT is output while sequentially accumulating photoelectric charge, generated by photodiodes of four subpixels, in the floating diffusion region FD1, and then, a reset operation is repeated. Alternatively, the process may use a readout method (i.e., an RSRSRSRSRSRSRSRS readout method) where a pixel signal VOUT based on one subpixel is output, and then, a reset operation is repeated.

Figure 10:
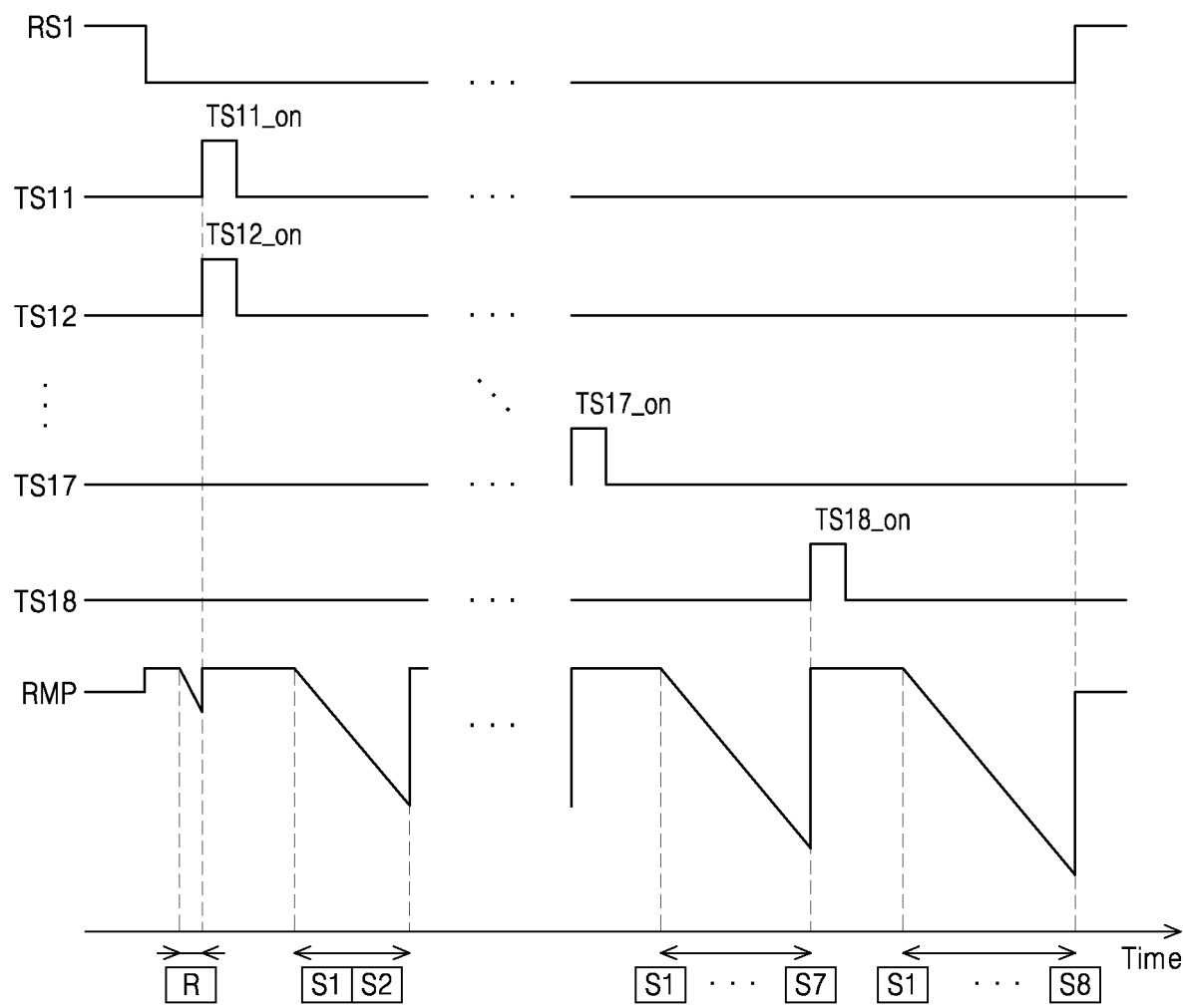

Referring collectively to FIGS. 5, 6C, and 10, the first transmission transistor TX11 of the first subpixel SPX11 and the second transmission transistor TX12 of the second subpixel SPX12 may be simultaneously turned ON, and the third to eighth transmission transistors of the third to eighth subpixels SPX13 to SPX18 may be sequentially turned ON. That is, the first transmission control signal TS11 and the second transmission control signal TS12 may be simultaneously shifted from a logic low level to a logic high level, and the third to eighth transmission control signals TS13 to TS18 may be sequentially shifted from a logic low level to a logic high level.

A first pulse R of a ramp voltage RMP may be a pulse corresponding to a pixel voltage VOUT of when the floating diffusion region FD1 of the first pixel group PG1h is reset. A second pulse S1S2 may be a pulse corresponding to a pixel signal VOUT based on photoelectric charge generated by the first photodiode PD11 of the first subpixel SPX11 and the second photodiode PD12 of the second subpixel SPX12. A third pulse S1 . . . S7 may be a pulse corresponding to a pixel signal VOUT based on photoelectric charge generated by the first to seventh photodiodes of the first to seventh subpixels SPX11 to SPX17, and a fourth pulse S1 . . . S8 may be a pulse corresponding to a pixel signal VOUT based on photoelectric charge generated by first to eighth photodiodes of the first to eighth subpixels SPX11 to SPX18.

That is, the first pixel group PG1h may first output a reset voltage as a pixel signal VOUT, and then, may output a pixel signal VOUT based on the first subpixel SPX11 and the second subpixel SPX12, output a pixel signal VOUT based on the first to third subpixels SPX11 to SPX13, output a pixel signal VOUT based on the first to fourth subpixels SPX11 to SPX14, output a pixel signal VOUT based on the first to fifth subpixels SPX11 to SPX15, output a pixel signal VOUT based on the first to sixth subpixels SPX11 to SPX16, output a pixel signal VOUT based on the first to seventh subpixels SPX11 to SPX17, and output a pixel signal VOUT based on the first to eighth subpixels SPX11 to SPX18. Such a readout method may be a reset-signal-signal-signal-signal-signal-signal-signal (RSSSSSSS) readout method.

In performing the AF function, the image sensor according to the present disclosure may not use some (i.e., non-selected ones) of the plurality of horizontal pixels PX_X included in the first pixel group PG1h. For example, since the first and second subpixels SPX11 and SPX12 simultaneously accumulate photoelectric charge in the floating diffusion region FD1, the first and second subpixels SPX11 and SPX12 may not be used for the AF function, and the third to eighth subpixels SPX13 to SPX18 may be used for the AF function.

In FIG. 10, a case where only the first and second subpixels SPX11 and SPX12 are not used for the AF function has been described above, but embodiments of the inventive concept are not limited thereto. The first and second subpixels SPX11 and SPX12 may simultaneously accumulate photoelectric charge in the floating diffusion region FD1, and then, the third and fourth subpixels SPX13 and SPX14 may simultaneously accumulate photoelectric charge in the floating diffusion region FD1, whereby the first to fourth subpixels SPX11 to SPX14 may not be used for the AF function. Such a readout method may be a reset-signal-signal-signal-signal-signal-signal (RSSSSSS) readout method. At this time, the fourth to eighth subpixels SPX14 to SPX18 may sequentially accumulate photoelectric charge in the floating diffusion region FD1, and thus, may be used for the AF function.

Alternatively, the first and second subpixels SPX11 and SPX12 may simultaneously accumulate photoelectric charge in the floating diffusion region FD1, the third and fourth subpixels SPX13 and SPX14 may simultaneously accumulate photoelectric charge in the floating diffusion region FD1 subsequently, and the fifth and sixth subpixels SPX15 and SPX16 may simultaneously accumulate photoelectric charge in the floating diffusion region FD1 subsequently, whereby the first to sixth subpixels SPX11 to SPX16 may not be used for the AF function. Such a readout method may be a reset-signal-signal-signal-signal-signal (RSSSSS) readout method. At this time, the seventh and eighth subpixels SPX17 and SPX18 may sequentially accumulate photoelectric charge in the floating diffusion region FD1, and thus, may be used for the AF function.

An image sensor according to certain embodiments of the inventive concept may operate such that subpixels of the same pixel among the first to eighth subpixels SPX11 to SPX18 accumulate photoelectric charge in the floating diffusion region FD1 simultaneously, thereby facilitating high-speed operation. However, in other embodiments, an image sensor may perform a method of accumulating photoelectric charge generated by photodiodes of four (4) subpixels in the floating diffusion region FD1, and repeating a reset operation. For example, such an image sensor may perform a readout method (e.g., an RSSSRSSS readout method) of repeating twice a method of primarily and simultaneously turning ON two transmission transistors of a single pixel, and then, sequentially turning ON the other transmission transistors one by one.

From the foregoing, those skilled in the art will recognize that a readout method for use with an image sensor according to embodiments of the inventive concept may be variously implemented.

Figure 11:
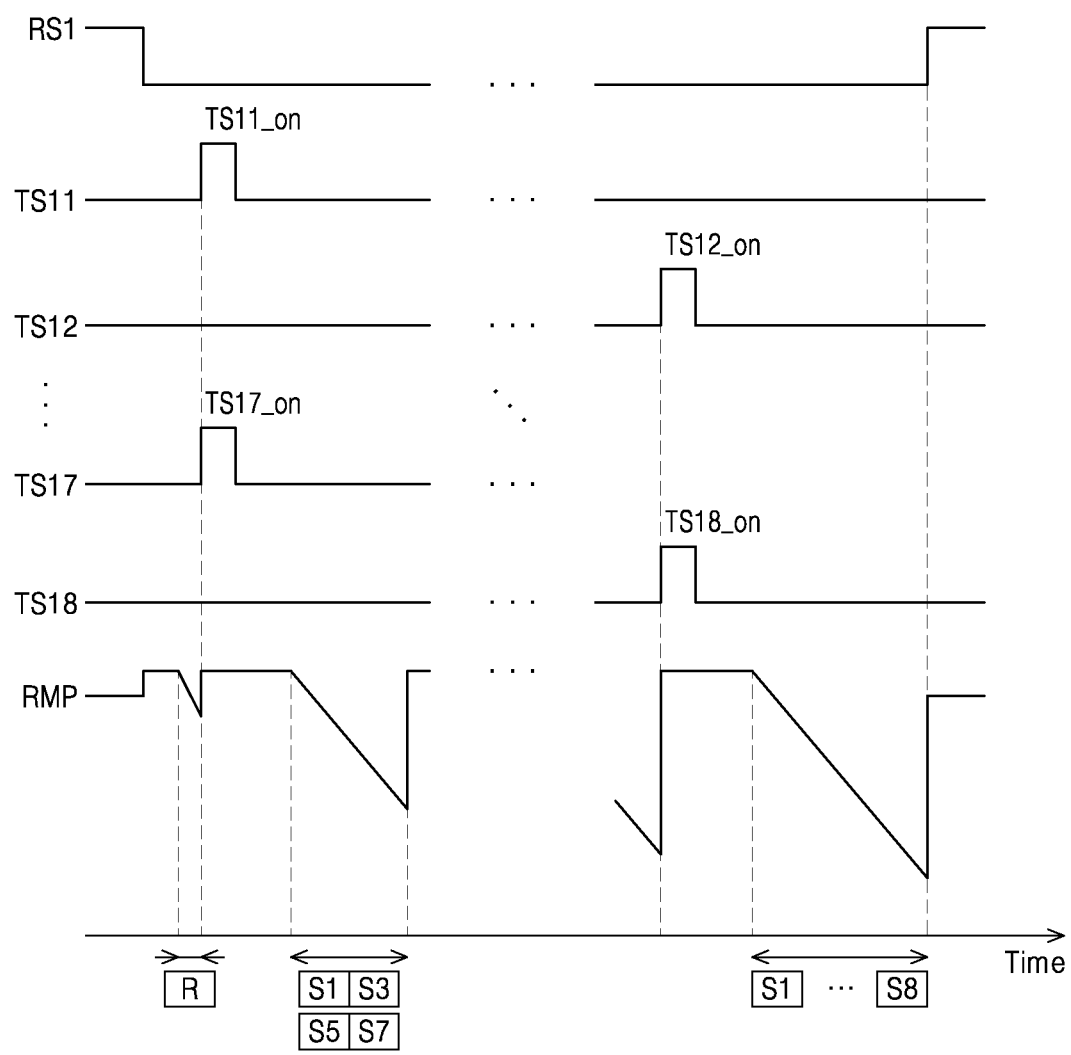

Referring collectively to FIGS. 5, 6C, and 11, transmission transistors of subpixels having the same phase may be simultaneously turned ON. For example, first, third, fifth, and seventh transmission transistors of the first, third, fifth, and seventh subpixels SPX11, SPX13, SPX15, and SPX17 phase may be simultaneously turned ON, and then, second, fourth, sixth, and eighth transmission transistors of second, fourth, sixth, and eighth subpixels SPX12, SPX14, SPX16, and SPX18 may be simultaneously turned ON. That is, the first, third, fifth, and seventh transmission control signals TS11, TS13, TS15, and TS17 may be simultaneously shifted from a logic low level to a logic high level, and the second, fourth, sixth, and eighth transmission control signals TS12, TS14, TS16, and TS18 may be simultaneously shifted from a logic low level to a logic high level.

A first pulse R of a ramp voltage RMP may be a pulse corresponding to a pixel voltage VOUT of when the floating diffusion region FD1 of the first pixel group PG1h is reset. A second pulse S1S3S5S7 may be a pulse corresponding to a pixel signal VOUT based on photoelectric charge generated by first, third, fifth, and seventh photodiodes of the first, third, fifth, and seventh subpixels SPX11, SPX13, SPX15, and SPX17. A third pulse S1 . . . S8 may be a pulse corresponding to a pixel signal VOUT based on photoelectric charge generated by the first to eighth photodiodes of the first to eighth subpixels SPX11 to SPX18. That is, the first pixel group PG1h may first output a reset voltage as a pixel signal VOUT, and then, may output a pixel signal VOUT based on the first, third, fifth, and seventh subpixels SPX11, SPX13, SPX15, and SPX17 and may output a pixel signal VOUT based on the first to eighth subpixels SPX11 to SPX18. Such a readout method may be a reset-signal-signal (RSS) readout method.

An image sensor according to embodiments of the inventive concept may perform an AF function in pixel group units in the low resolution mode. That is, the AF function may be performed by comparing a pixel signal VOUT based on photoelectric charge generated by the first, third, fifth, and seventh photodiodes with a pixel signal VOUT based on photoelectric charge generated by the second, fourth, sixth, and eighth photodiodes. The amount of photoelectric charge generated by one photodiode may be reduced in a low illumination environment, and thus, the image sensor may accumulate all photoelectric charge generated by a plurality of photodiodes in order to properly perform the AF function.

However, the image sensor according to the present disclosure is not limited to the embodiment illustrated in FIG. 11. For example, the first pixel group PG1h may output a pixel signal VOUT based on the first, third, fifth, and seventh subpixels SPX11, SPX13, SPX15, and SPX17 and may be reset, and then, may output a pixel signal VOUT based on the second, fourth, sixth, and eighth subpixels SPX12, SPX14, SPX16, and SPX18 in a reset-signal-reset-signal (RSRS) readout method. In a reset-signal-reset-signal-reset-signal-reset-signal (RSRSRSRS) readout method, the first pixel group PG1h may first output a reset voltage as a pixel signal VOUT, and then, may output a pixel signal VOUT based on the first and fifth subpixels SPX11 and SPX15 and may be reset, may output a pixel signal VOUT based on the second and sixth subpixels SPX12 and SPX16 subsequently and may be reset again, may output a pixel signal VOUT based on the third and seventh subpixels SPX13 and SPX17 subsequently and may be reset again, and may output a pixel signal VOUT based on the fourth and eighth subpixels SPX14 and SPX18 subsequently. In a reset-signal-signal-reset-signal-signal (RSSRSS) readout method, the first pixel group PG1h may first output a reset voltage as a pixel signal VOUT, and then, may output a pixel signal VOUT based on the first and fifth subpixels SPX11 and SPX15, may output a pixel signal VOUT based on the first, second, fifth, and sixth subpixels SPX11, SPX12, SPX15, and SPX16 subsequently and may be reset, may output a pixel signal VOUT based on the third and seventh subpixels SPX13 and SPX17, and may output a pixel signal VOUT based on the third, fourth, seventh, and eighth subpixels SPX13, SPX14, SPX17, and SPX18. The image sensor according to the present disclosure is not limited to operating based on the above-described operating methods (for example, the reset-signal-signal-reset-signal-signal (RSSRSS) readout method. Various combinations of the above-described operating methods may be applied to the image sensor according to the present disclosure.

Figure 12:
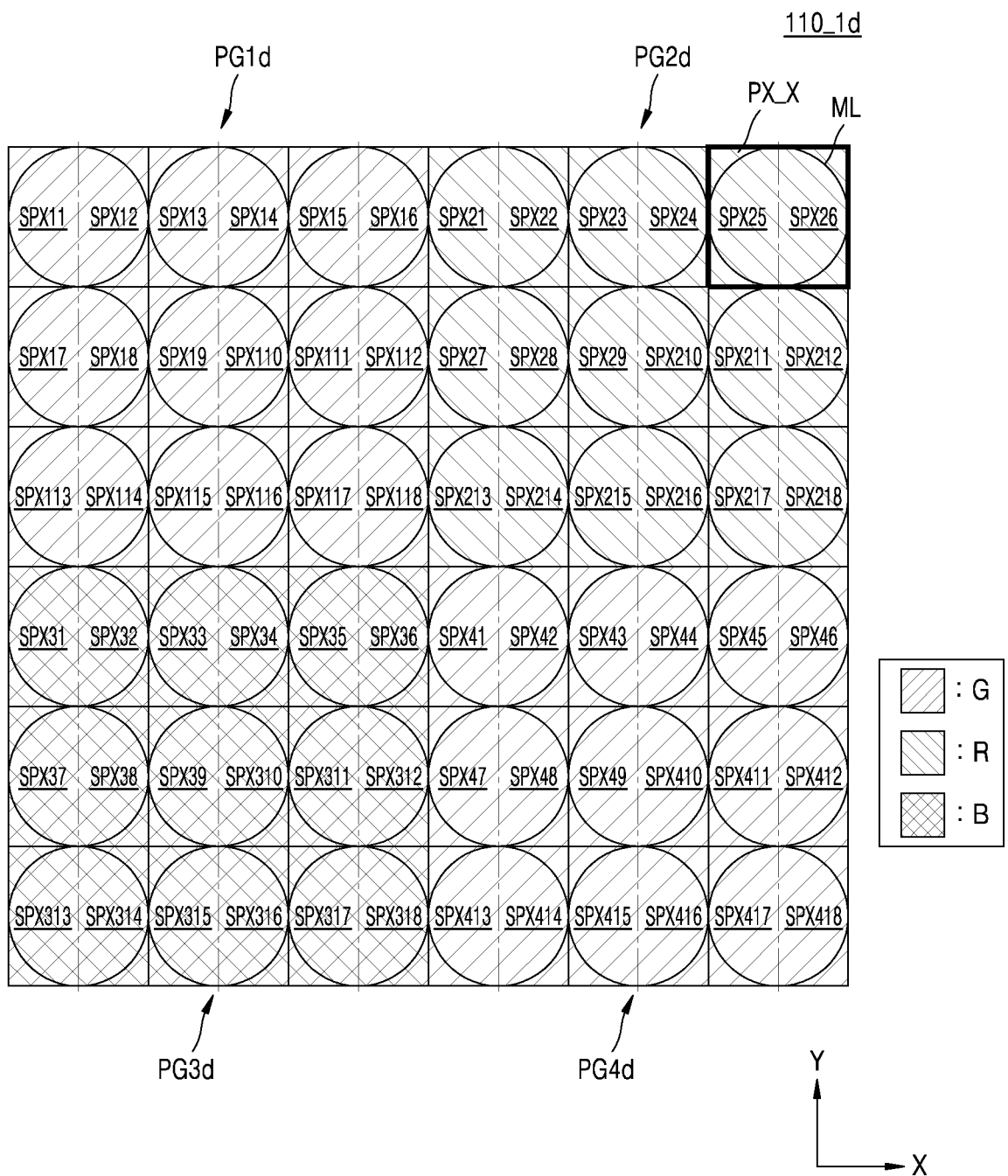
FIG. 12 is a diagram further illustrating in still another embodiment the pixel array 110 of FIG. 2.

FIG. 12 is yet another diagram illustrating a pixel array of an image sensor according to certain embodiments of the inventive concept.

Referring to FIGS. 3A and 12, a first subpixel array 110_1d includes a plurality of horizontal pixels PX_X arranged in a row direction (i.e., a first direction X) and in a column direction (i.e., a second direction Y). Each of the horizontal pixels PX_X is further assumed to be operationally configured with a micro-lens ML.

In the illustrated embodiment, each of first to fourth pixel groups PG1d to PG4d includes nine (9) horizontal pixels PX_X, wherein each one of the horizontal pixels PX_X include two (2) subpixels adjacently disposed in the first direction X. For example, each of the first to fourth pixel groups PG1d to PG4d may include eighteen subpixels arranged in three rows, six columns. For example, the first pixel group PG1d may include first to eighteen subpixels SPX11 to SPX118, the second pixel group PG2d may include first to eighteen subpixels SPX21 to SPX218, the third pixel group PG3d may include first to eighteen subpixels SPX31 to SPX318, and the fourth pixel group PG4d may include first to eighteen subpixels SPX41 to SPX418.

The first subpixel array 110_1d may variously include one or more color filter(s) as previously described. Here, the respective horizontal pixels PX_X of each one first to fourth pixel groups PG1d to PG4d are associated with a selected color filter.

In an embodiment, the first subpixel array 110_1d may be configured according to a shared pixel structure wherein two subpixels for each of the horizontal pixels PX_X share a floating diffusion region. Thus, the first subpixel array 110_1d may include nine (9) floating diffusion regions for each pixel group PG1d, PG2d, PG3d and PG4d.

In one approach, the first subpixel array 110_1d may be configured in a shared pixel structure wherein horizontal pixels PX_X disposed in the same row of a pixel group share one floating diffusion region. Alternatively, the first subpixel array 110_1d may be configured in a shared pixel structure wherein horizontal pixels PX_X disposed in the same column of a pixel group share one floating diffusion region. In this manner, three (3) floating diffusion regions may be provided in each pixel group.

In another approach, horizontal pixels PX_X included one or more pixel group(s) may share a floating diffusion region. For example, the horizontal pixels PX_X included in different pixel groups may share different floating diffusion regions. Alternatively, horizontal pixels PX_X included in different pixel groups adjacent to each other in a row direction (i.e., the first direction X) may share different floating diffusion regions. Alternatively, for example, horizontal pixels PX_X included in different pixel groups adjacent to each other in a column direction (i.e., the second direction Y) may share different floating diffusion regions. Alternatively, for example, pixels PX_X included in the first to fourth pixel groups PG1d to PG4d may share different floating diffusion regions.

In an embodiment, an image sensor including the first subpixel array 110_1d may perform an AF function in pixel units while operating in a first mode (i.e., the high resolution mode), but perform the AF function in pixel group units while operating in a second mode (i.e., the low resolution mode). For example, resolution associated with the low resolution mode may be less than or equal to about ⅑ times the resolution associated with a high resolution mode.

As previously noted, image sensors according to embodiments of the inventive concept may effectively provide accurate AF function capabilities across a range of illumination environments using multiple resolution modes. Specific examples of high, low and medium resolution modes have been described above, but embodiments of the inventive concept may use any reasonable number of resolution modes having variously defined relationships. For example, resolution associated with a medium resolution mode may range from between ⅙ times the resolution associated with a high resolution mode to ⅓ times the resolution associated with the high resolution mode.

Several of the foregoing embodiments have assumed that use of four (4) pixel groups. However, embodiments of the inventive concept are not limited thereto. For example the horizontal pixels PX_X and/or vertical pixels PX_Y of a subpixel array may be functionally divided into 2, 4, 8, 16 or 32 pixel groups.

While the inventive concept has been particularly shown and described with reference to embodiments thereof, it will be understood that various changes in form and details may be made therein without departing from the spirit and scope of the following claims.

What is claimed is:

1. An image sensor selectively adapted for use in multiple resolution modes including a low resolution mode, a medium resolution mode, and a high resolution mode, the image sensor comprising:
   a pixel array comprising a plurality of pixels arranged in a row direction and a column direction, wherein each pixel in the plurality of pixels has a shared pixel structure,
   wherein the shared pixel structure comprises:
      a first subpixel including a first photoelectric conversion element selectively transmitting photoelectric charge to a floating diffusion region via a first transmission transistor in response to a first transmission signal,
      a second subpixel including a second photoelectric conversion element selectively transmitting photoelectric charge to the floating diffusion region via a second transmission transistor in response to a second transmission signal,
      a reset transistor configured to selectively reset photoelectric charge accumulated in the floating diffusion region in response to a reset signal,
      a driver transistor and a selection transistor selectively connecting the floating diffusion region to a pixel signal output in response to a selection signal,
      the floating diffusion region, the reset transistor, the driver transistor and the selection transistor are shared by the first subpixel and the second subpixel, and the first subpixel and the second subpixel are adjacently disposed; and
   a row driver configured to provide the first transmission signal, the second transmission signal, the reset signal and the selection signal, such that performing of an auto focus (AF) function includes performing the AF function according to units of the plurality of pixels in the high resolution mode, performing the AF function according to units of pixels arranged in the same row in one pixel group in the medium resolution mode, and performing the AF function according to units of pixel groups in low resolution mode.

2. The image sensor of claim 1, wherein
   a plurality of pixels comprised in the same pixel group among a plurality of pixel groups are configured to share a floating diffusion region, and
   the row driver is configured to provide the first transmission signal, the second transmission signal, the reset signal and the selection signal so that photoelectric charges generated by the plurality of pixels comprised in the same pixel group are all accumulated into the floating diffusion region and then are reset.

3. The image sensor of claim 1, wherein
   at least two pixel groups disposed adjacent to each other among are configured to share a floating diffusion region.

4. The image sensor of claim 1, wherein the high resolution mode has a first resolution,
   the medium resolution mode has second resolution ranging from between about ¼ the first resolution to about ½ the first resolution, and
   the low resolution mode has a third resolution less than or equal to about ¼ the first resolution.

5. An image sensor selectively adapted for use in multiple resolution modes including a low resolution mode, a medium resolution mode, and a high resolution mode, the image sensor comprising:
   a controller configured to control the operation of a row driver and a signal read unit;
   a pixel array comprising a plurality of pixels arranged in a row direction and a column direction and configured to provide a pixel signal in response to received incident light, wherein each pixel in the plurality of pixels comprises a micro-lens, a first subpixel including a first photodiode, a second subpixel including a second photodiode, and the first subpixel and the second subpixel are adjacently disposed and share a floating diffusion region,
   wherein the row driver is configured to provide control signals to the pixel array to control performing of an auto focus (AF) function, such that performing of an auto focus (AF) function includes performing the AF function according to units of the plurality of pixels in the high resolution mode, performing the AF function according to units of pixels arranged in the same row in one pixel group in the medium resolution mode, and performing the AF function according to units of pixel groups in low resolution mode.

6. The image sensor of claim 5, wherein the high resolution mode has a first resolution,
   the medium resolution mode has second resolution ranging from between about ¼ the first resolution to about ½ the first resolution, and
   the low resolution mode has a third resolution less than or equal to about ¼ the first resolution.

7. The image sensor of claim 5, wherein the pixel array include a first pixel group and a second pixel group adjacently disposed to the first pixel group,
   the first pixel group and the second pixel group include pixels arranged in a first direction and a second direction,
   all of the pixels of the first pixel group are associated with a first color filter, and
   all of the pixels of the second pixel group are associated with a second color filter different from the first color filter.

8. The image sensor of claim 5, wherein the pixel array include a first pixel group and a second pixel group adjacently disposed to the first pixel group,
- the first pixel group and the second pixel group include pixels arranged in a first direction and a second direction,
- at least one of the pixels of the first pixel group is associated with a first color filter, and
- at least one of the pixels of the second pixel group is associated with a second color filter different from the first color filter, and
- the first color filter and the second color filter is respectively selected from a group of color filters including; a red filter, a blue filter, a green filter, a white filter and a yellow filter.

9. The image sensor of claim 5, wherein the pixel array include a first pixel group and a second pixel group adjacently disposed to the first pixel group,
- the first pixel group and the second pixel group include pixels arranged in a first direction and a second direction,
- at least one of the pixels of the first pixel group is associated with a first color filter and at least another one of the pixels of the first pixel group is associated with a second color filter, and
- at least one of the pixels of the second pixel group is associated with a third color filter and at least another one of the pixels of the second pixel group is associated with a fourth color filter.

10. The image sensor of claim 9, wherein the first color filter and the third color filter are different color filters.

11. The image sensor of claim 10, wherein the second color filter and the fourth color filter are the same color filter.

12. The image sensor of claim 5, wherein the pixel array include a first pixel group and a second pixel group adjacently disposed to the first pixel group,
- the first pixel group and the second pixel group include pixels arranged in a first direction and a second direction,
- at least two of the pixels of the first pixel group are respectively associated with a first color filter and a second color filter different from the first color filter, and
- at least two of the pixels of the second pixel group are respectively associated with a third color filter and a fourth color filter different from the third color filter.

* * * * *